(12) United States Patent
Cho et al.

(10) Patent No.: US 10,674,572 B2
(45) Date of Patent: Jun. 2, 2020

(54) DISPLAY DEVICE AND ELECTRONIC DEVICE COMPRISING SAME

(71) Applicant: Samsung Electronics Co., Ltd., Gyeonggi-do (KR)

(72) Inventors: Sung-Gun Cho, Gyeonggi-do (KR); Jae-Hee Kim, Gyeonggi-do (KR); Dae-Hyeong Park, Gyeonggi-do (KR); Jong-Min Choi, Gyeonggi-do (KR); Woong-Chan Kim, Suwon-si (KR); Uy-Hyeon Jeong, Gyeonggi-do (KR)

(73) Assignee: Samsung Electronics Co., Ltd., Yeongtong-gu, Suwon-si, Gyeonggi-do (KR)

(*) Notice: Subject to any disclaimer, the term of this patent is extended or adjusted under 35 U.S.C. 154(b) by 0 days.

(21) Appl. No.: 16/329,270

(22) PCT Filed: Jun. 2, 2017

(86) PCT No.: PCT/KR2017/005794
§ 371 (c)(1),
(2) Date: Feb. 28, 2019

(87) PCT Pub. No.: WO2018/043873
PCT Pub. Date: Mar. 8, 2018

(65) Prior Publication Data
US 2019/0254129 A1     Aug. 15, 2019

(30) Foreign Application Priority Data
Sep. 2, 2016 (KR) .................. 10-2016-0113235

(51) Int. Cl.
*H05B 33/04* (2006.01)
*H04M 1/02* (2006.01)
(Continued)

(52) U.S. Cl.
CPC ........... *H05B 33/04* (2013.01); *G06F 1/1656* (2013.01); *G06F 3/0412* (2013.01); *H01L 27/32* (2013.01);
(Continued)

(58) Field of Classification Search
CPC . H04M 1/0266; H04M 1/0268; G06F 1/1656; G06F 3/0412; H04B 2001/3894;
(Continued)

(56) References Cited

U.S. PATENT DOCUMENTS 8,442,593 B1* 5/2013 Kwon ................. H04M 1/0266
455/556.1
2009/0322214 A1* 12/2009 Lee ....................... H01L 51/524
313/504
(Continued)

FOREIGN PATENT DOCUMENTS

JP      2013-073175 A      4/2013
KR   10-2012-0131416 A    12/2012
(Continued)

OTHER PUBLICATIONS

European Search Report dated May 17, 2019.

*Primary Examiner* — Mariceli Santiago
(74) *Attorney, Agent, or Firm* — Cha & Reiter, LLC

(57) ABSTRACT

A display device and/or an electronic device including the same, according to various embodiments of the present invention, may comprise: a window member; an optical adhesive layer applied on an inner surface of the window member; a display panel bonded on the inner surface of the window member with the optical adhesive layer interposed therebetween; a bonding region which is disposed at at least one edge of the display panel such that a portion of the display panel extends beyond the optical adhesive layer to directly face the window member; a first space, formed
(Continued)

between the window member and the bonding region, at least corresponding to the thickness of the optical adhesive layer; and a sealing member at least partially filled in the first space. The electronic device as above may vary according to embodiments.

13 Claims, 13 Drawing Sheets

(51) Int. Cl.
| | |
|---|---|
| *H04M 1/18* | (2006.01) |
| *G06F 1/16* | (2006.01) |
| *H01L 27/32* | (2006.01) |
| *H01L 51/52* | (2006.01) |
| *H04B 1/38* | (2015.01) |
| *H05K 1/02* | (2006.01) |
| *G06F 3/041* | (2006.01) |

(52) U.S. Cl.
CPC ........... *H01L 51/5246* (2013.01); *H04B 1/38* (2013.01); *H04M 1/02* (2013.01); *H04M 1/0266* (2013.01); *H04M 1/18* (2013.01); *H05K 1/0277* (2013.01); *H04B 2001/3894* (2013.01)

(58) Field of Classification Search
CPC ....... H05B 33/04; H01L 27/32; H01L 27/323; H01L 51/5237
See application file for complete search history.

(56) References Cited

U.S. PATENT DOCUMENTS

| | | | |
|---|---|---|---|
| 2013/0083272 A1 | 4/2013 | Tanabe et al. | |
| 2014/0125911 A1* | 5/2014 | Lee ................... | G02F 1/133308 349/58 |
| 2014/0292184 A1 | 10/2014 | Lee | |
| 2016/0066461 A1 | 3/2016 | Park et al. | |
| 2016/0161770 A1* | 6/2016 | Joo ........................ | G02F 1/0102 359/241 |
| 2016/0202726 A1* | 7/2016 | Seen ................... | H04M 1/0268 349/42 |
| 2017/0099742 A1* | 4/2017 | Choi ....................... | H04M 1/18 |

FOREIGN PATENT DOCUMENTS

| | | |
|---|---|---|
| KR | 10-2014-0117960 A | 10/2014 |
| KR | 10-2016-0003487 A | 1/2016 |
| KR | 10-2016-0028581 A | 3/2016 |

* cited by examiner

DISPLAY DEVICE AND ELECTRONIC DEVICE COMPRISING SAME

CROSS-REFERENCE TO RELATED APPLICATION(S)

This application is a National Phase Entry of PCT International Application No. PCT/KR2017/005794, which was filed on Jun. 2, 2017, and claims priority to Korean Patent Application No. 10-2016-0113235, which was filed on Sep. 2, 2016, the contents of which are incorporated herein by reference.

BACKGROUND

1. Field

The present disclosure generally relates to an electronic device, and more particularly, to an electronic device with a display device, which has a waterproof function.

2. Description of the Related Art

In general, an electronic device refers to a device that executes a specific function according to a loaded program, such as a home appliance, an electronic note, a portable multimedia player (PMP), a mobile communication terminal, a tablet personal computer (PC), a video/audio player, a desktop/laptop computer, an in-vehicle navigator, etc. For example, these electronic devices may output stored information visually or audibly. As the integration level of electronic devices has increased and ultra-high speed, large-capacity wireless communication has become popular, single mobile communication terminals have recently been equipped with various functions. For example, entertainment functions such as gaming, multimedia functions such as music/video playing, communication and security functions for mobile banking, and other functions such as scheduling and electronic wallets have been integrated into one electronic device.

Such an electronic device may need a dustproof and waterproof structure to ensure reliable operation and prevent the introduction of foreign materials according to environment in which they are used. For example, an electronic device that a user carries with him or her, such as a mobile communication terminal, an electronic note, or a tablet PC, may be exposed to various operation environments during daily life. In order to ensure stable operation performance by preventing contamination caused by the introduction of foreign materials against a change in the operation environment, various types of dustproof and waterproof structures may be provided to the electronic device.

SUMMARY

In an electronic device, a display device may provide various types of user interfaces by outputting information visually. When a portable electronic device is equipped with a display device, the display device needs to be designed so that the electronic device can be small, but such that the screen can be large. However, since the area for mechanically (or physically) mounting the display in a case or housing of the electronic device should be secured, the area which appears to be included in the display device but does not actually output a screen (called "bezel area") may be formed.

In general, a sufficient bezel area may facilitate the electronic device having dustproof and waterproof functions. However, as the bezel area becomes larger, the difference between the area appearing to be included in the display device and the area that actually outputs a screen may become larger. For example, with a larger bezel area, a screen output area with respect to the actual size of the electronic device may be smaller.

An aspect of the present disclosure may provide a display device for securing a sufficient size for an area that actually outputs a screen by reducing a bezel area, and an electronic device including the display device.

Another aspect of the present disclosure may provide a display device which secures a screen output area of a sufficient size and which is equipped with improved dustproof and waterproof functions, and an electronic device including the display device.

Another aspect of the present disclosure may provide a display device designed to facilitate the formation and arrangement of a dustproof and waterproof structure, and an electronic device including the display device.

In one aspect of the present disclosure, a display device and/or an electronic device including the same may include:
a window member;
an optical adhesive layer coated on an inner surface of the window member;
a display panel bonded on the inner surface of the window member, with the optical adhesive layer therebetween;
a bonding area in which a part of the display panel extends beyond the optical adhesive layer from an edge of at least one side of the display panel, and directly faces the window member;
a first space formed between the window member and the bonding area, in correspondence with the thickness of at least the optical adhesive layer; and
a sealing member filled at least partially in the first space.

In another aspect of the present disclosure, an electronic device may include:
a housing;
a window member mounted on a front surface of the housing;
a display panel having one surface bonded to an inner surface of the window member by an optical adhesive layer coated on the inner surface of the window member;
at least one first waterproof member bonding a part of the window member to the housing;
at least one second waterproof member bonding a part of the other surface of the display panel to the housing, and having one end portion disposed adjacent to one end portion of the first waterproof member;
a bonding area being a part of the display panel, extending beyond the optical adhesive layer from an edge of a side of the display panel, and disposed to face the window member directly;
a first space formed between the window member and the bonding area in a section between the first waterproof member and the second waterproof member, in correspondence with the thickness of the optical adhesive layer; and
a sealing member sealing at least a part of the first space in a section between one end portion of the first waterproof member and one end portion of the second waterproof member, while connecting the first waterproof member to the second waterproof member.

The display device and/or the electronic device including the same may facilitate the reduction of a bezel area, because a display panel is at least partially attached directly to a case or housing of the electronic device. For example, a maximum screen output area may be secured in an area or space allowed by the electronic device. According to an embodiment, a part of a window member that protects the display device may be attached onto a first part of the case or housing of the electronic device, and a part of the display panel may be attached onto a second part of the case or housing of the electronic device. As a space defined by a step between the first part and the second part (e.g., a path in which foreign materials may be introduced) is sealed by a sealing member, a dustproof and waterproof structure may be formed. In view of the structure of the display device, a narrow space may be formed between the display panel and the window member. The display device (and/or the display panel), according to various embodiments of the present disclosure, facilitates the arrangement of the sealing member even in this narrow space, thereby improving dustproof and waterproof functions.

DETAILED DESCRIPTION

Figure 1:
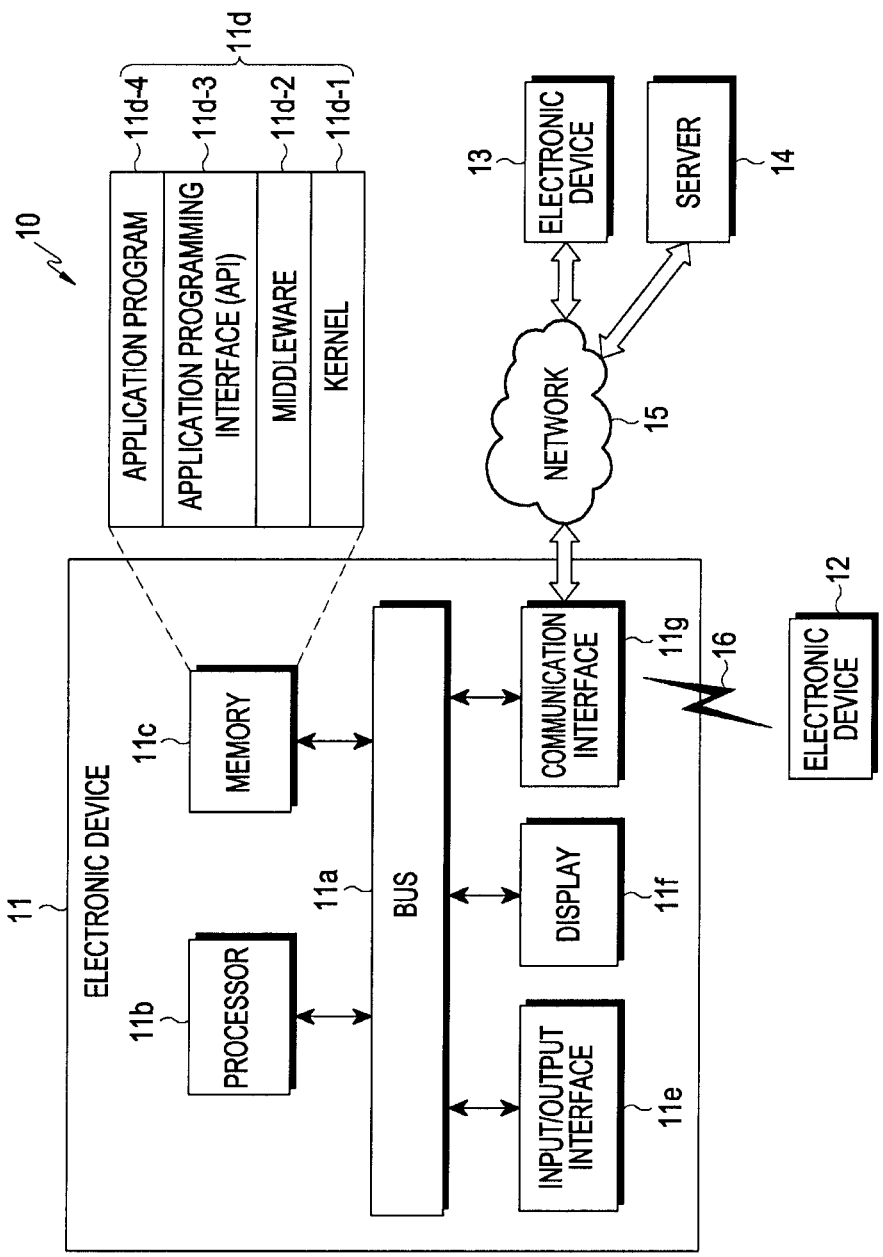
FIG. 1 is a block diagram illustrating a network environment including an electronic device according to various embodiments of the present disclosure.

Various embodiments of the present disclosure are described with reference to the accompanying drawings. However, the scope of the present disclosure is not intended to be limited to the particular embodiments, and it is to be understood that the present disclosure covers various modifications, equivalents, and/or alternatives falling within the scope and spirit of the present disclosure.

Ordinal terms as used in the present disclosure, such as 'first' and 'second' may be used to describe various components, not limiting the components. These expressions are used only to distinguish one component from another component. For example, a first component may be referred to as a second component and vice versa without departing from the scope of the present disclosure. The term 'and/or' includes a combination or any of a plurality of related items.

The relative terms such as 'front surface', 'rear surface', 'top surface', and 'bottom surface' described as they are shown in the drawings may be replaced with ordinal terms such as 'first', 'second', and the like. The sequence of the ordinal numbers such as 'first', 'second', and the like is determined as mentioned or arbitrarily, and thus may be changed freely when needed.

The terms as used in the present disclosure are provided to merely describe specific embodiments, not intended to limit the scope of the present disclosure. It is to be understood that singular forms include plural referents unless the context clearly dictates otherwise. In the present disclosure, the term "include" or "have" signifies the presence of a feature, number, step, operation, component, part, or combination thereof, not excluding the presence of one or more other features, numbers, steps, operations, components, parts, or combinations thereof.

Unless otherwise defined, the terms and words including technical or scientific terms used in the following description and claims may have the same meanings as generally understood by those skilled in the art. The terms as generally defined in dictionaries may be interpreted as having the same or similar meanings as or to contextual meanings of related technology. Unless otherwise defined, the terms should not be interpreted as ideally or excessively formal meanings.

According to the present disclosure, an electronic device may be any device equipped with a touch panel, and an electronic device may also be called a terminal, a portable terminal, a mobile terminal, a communication terminal, a portable communication terminal, a portable mobile terminal, a display device, or the like.

For example, an electronic device may be a smart phone, a portable phone, a navigation device, a game console, a television (TV), an in-vehicle head unit, a laptop computer, a tablet computer, a portable multimedia player (PMP), a personal digital assistant (PDA), or the like. An electronic device may be configured as a pocket-size portable communication terminal equipped with a wireless communication function. Further, an electronic device may be a flexible device or a flexible display device.

The electronic device may communicate with an external electronic device such as a server, or perform a task through interaction with an external electronic device. For example, the electronic device may transmit an image captured by a camera and/or location information detected by a sensor unit to a server through a network. The network may be, but not limited to, a mobile or cellular communication network, a local area network (LAN), a wireless local area network (WLAN), a wide area network (WAN), the Internet, a small area network (SAN), or the like.

Referring to FIG. 1, an electronic device 11 in a network environment 10 according to various embodiments is described. The electronic device 11 may include a bus 11a, a processor 11b, a memory 11c, an input/output (I/O) interface 11e, a display 11f, and a communication interface 11g. In some embodiments, at least one of the components may be omitted in the electronic device 11 or a component may be added to the electronic device 11. The bus 11a may include a circuit that interconnects the components 11a to 11g and allows communication (for example, control messages or data) between the components 11a to 11g. The processor 11b may include one or more of a central processing unit (CPU), an application processor (AP), and a communication processor (CP). The processor 11b may, for example, execute computation or data processing related to control and/or communication of at least one other component of the electronic device 11.

The memory 11c may include a volatile memory and/or a non-volatile memory. The memory 11c may, for example, store instructions or data related to at least one other component. According to an embodiment, the memory 11c may store software and/or programs 11d. The programs 11d may include, for example, a kernel 11d-1, middleware 11d-2, an application programming interface (API) 11d-3, and/or application programs (or applications) 11d-4. At least a part of the kernel 11d-1, the middleware 11d-2, or the API 11d-3 may be called an operating system (OS). The kernel 11d-1 may control or manage system resources (for example, the bus 11a, the processor 11b, or the memory 11c) that are used in executing operations or functions implemented in other programs (for example, the middleware 11d-2, the API 11d-3, or the application programs 11d-4). Also, the kernel 11d-1 may provide an interface for allowing the middleware 11d-2, the API 11d-3, or the application programs 11d-4 to access and control or manage individual components of the electronic device 11.

The middleware 11d-2 may serve as a medium through which the kernel 11d-1 may communicate with the API 11d-3 or the application programs 11d-4 to transmit and receive data. Also, the middleware 11d-2 may process one or more task requests received from the application programs 11d-4. For example, the middleware 11d-2 may assign priorities for using system resources (the bus 11a, the processor 11b, or the memory 11c) of the electronic device 11 to at least one of the application programs 11d-4, and process the one or more task requests according to the priorities assigned to the at least one application program 11d-4. The API 11d-3 is an interface that may control functions that the application programs 11d-4 provide at the kernel 11d-1 or the middleware 11d-2. For example, the API 11d-3 may include at least one interface or function (for example, a command) for file control, window control, video processing, or text control. The I/O interface 11e may, for example, act as an interface that provides a command or data received from a user or an external device to the other component(s) of the electronic device 11. Further, the I/O interface 11e may output a command or data received from the other component(s) to the user or the external device.

The display 11f may include, for example, a liquid crystal display (LCD), a light emitting diode (LED) display, an organic LED (OLED) display, a microelectromechanical systems (MEMS) display, or an electronic paper display. The display 11f may display, for example, various types of content (for example, text, an image, a video, an icon, and/or a symbol) to the user. The display 11f may include a touch screen and receive, for example, a touch input, a gesture input, a proximity input, or a hovering input through an electronic pen or a user's body part. The communication interface 11g may establish communication between the electronic device 11 and an external device (for example, a first electronic device 12, a second electronic device 13, or a server 14). For example, the communication interface 11g may be connected to a network 15 by wireless or wired communication and communicate with the external device (for example, the second electronic device 13 or the server 14) over the network 15.

The wireless communication may be conducted by cellular communication conforming to, for example, at least one of long term evolution (LTE), LTE-advanced (LTE-A), code division multiple access (CDMA), wideband CDMA (WCDMA), universal mobile telecommunication system (UMTS), wireless broadband (WiBro), or global system for mobile communications (GSM)). According to an embodiment, the wireless communication may include, for example, at least one of wireless fidelity (WiFi), Bluetooth, Bluetooth low energy (BLE), Zigbee, near field communication (NFC), magnetic secure transmission (MST), radio frequency (RF), or body area network (BAN). According to an embodiment, the wireless communication may include GNSS. GNSS may be, for example, global positioning system (GPS), global navigation satellite system (Glonass), Beidou navigation satellite system (hereinafter, referred to as 'Beidou'), or Galileo, the European global satellite-based navigation system. In the present disclosure, the terms 'GPS' and 'GNSS' are interchangeably used with each other. The wired communication may be conducted in conformance to, for example, at least one of universal serial bus (USB), high definition multimedia interface (HDMI), recommended standard 232 (RS-232), power line communication, or plain old telephone service (POTS). The network 15 may be a telecommunication network, for example, at least one of a computer network (for example, LAN or WAN), the Internet, or a telephone network.

Each of the first and second external electronic devices 12 and 13 may be of the same type as or a different type from the electronic device 11. According to various embodiments, all or a part of operations performed in the electronic device 11 may be performed in one or more other electronic devices (for example, the electronic devices 12 and 13 or the server 14). According to an embodiment, if the electronic device 11 is to perform a function or a service automatically or upon request, the electronic device 11 may request at least a part of functions related to the function or the service to another device (for example, the electronic device 12 or 13 or the server 14), instead of performing the function or the service autonomously, or additionally. The other device (for example, the electronic device 12 or 13 or the server 14) may execute the requested function or an additional function and provide a result of the function execution to the electronic device 11. The electronic device 11 may provide the requested function or service based on the received result or by additionally processing the received result. For this purpose, for example, cloud computing, distributed computing, or client-server computing may be used.

Figure 2:
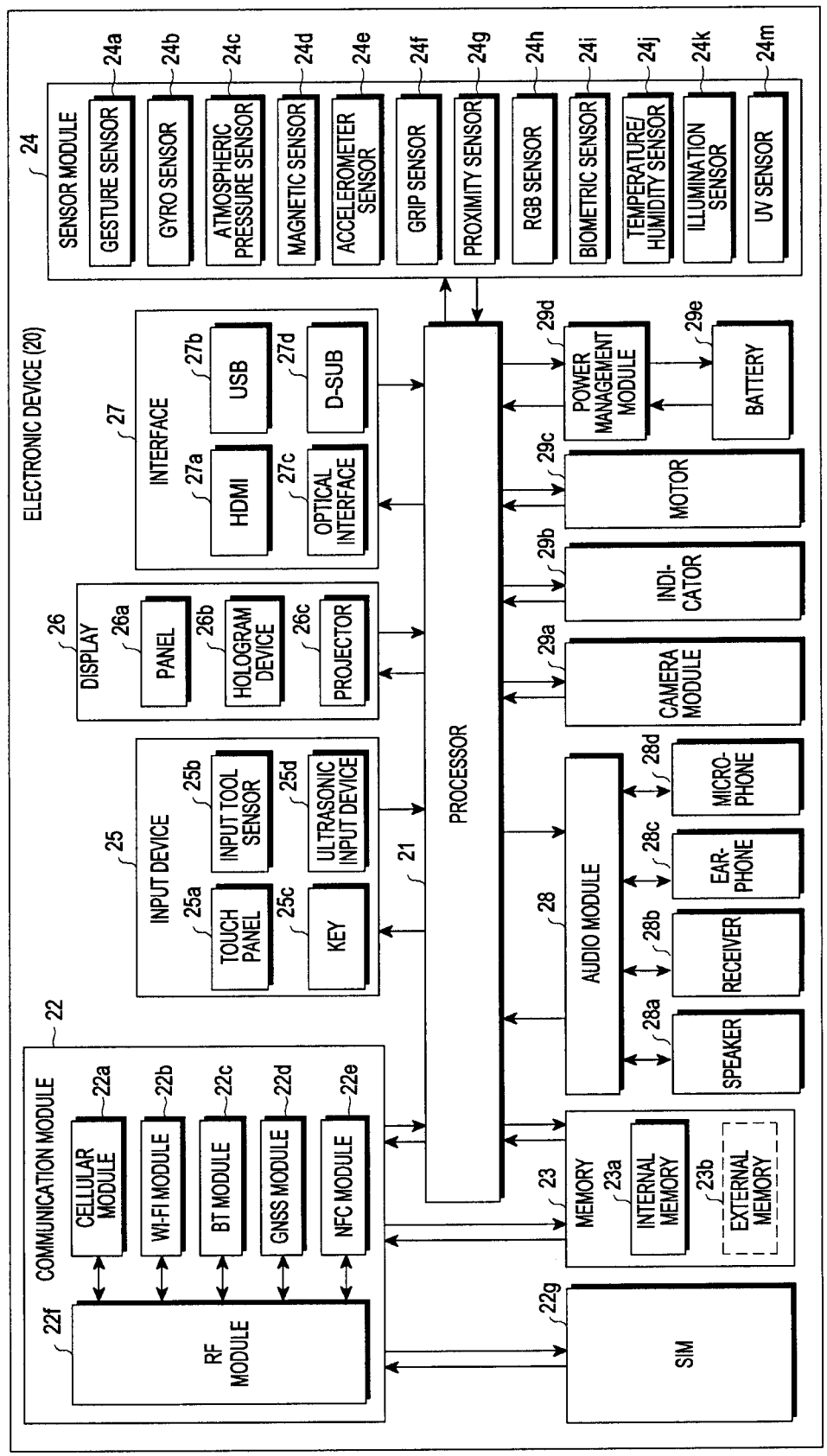
FIG. 2 is a block diagram illustrating an electronic device according to various embodiments of the present disclosure.

FIG. 2 is a block diagram of an electronic device 20 according to various embodiments of the present disclosure. The electronic device 20 may include, for example, the whole or part of the electronic device 11 illustrated in FIG. 1 and/or an electronic device 100 illustrated in FIG. 3 as described later. The electronic device 20 may include at least one processor (for example, AP) 21, a communication module 22, a subscriber identification module (SIM) 22g, a memory 23, a sensor module 24, an input device 25, a display 26, an interface 27, an audio module 28, a camera module 29a, a power management module 29d, a battery 29e, an indicator 29b, and a motor 29c. The processor 21 may, for example, control a plurality of hardware or software components that are connected to the processor 21 by executing an OS or an application program and may perform processing or computation of various types of data. The processor 21 may be implemented, for example, as a system on chip (SoC). According to an embodiment, the processor 21 may further include a graphics processing unit (GPU) and/or an image signal processor. The processor 21 may include at least a part (for example, a cellular module 22a) of the components illustrated in FIG. 2. The processor 21 may load a command or data received from at least one of other components (for example, a non-volatile memory), process the loaded command or data, and store result data in the non-volatile memory.

The communication module 22 may include, for example, the cellular module 22a, a WiFi module 22b, a Bluetooth (BT) module 22c, a GNSS module 22d, an NFC module 22e, and an RF module 22f. The cellular module 22a may provide services such as voice call, video call, text service, or the Internet through a communication network. According to an embodiment, the cellular module 22a may identify and authenticate the electronic device 20 within a communication network, using the SIM (for example, a SIM card) 22g. According to an embodiment, the cellular module 22a may perform at least a part of the functionalities of the processor 21. According to an embodiment, the cellular module 22a may include a CP. According to an embodiment, at least a part (for example, two or more) of the cellular module 22a, the WiFi module 22b, the BT module 22c, the GNSS module 22d, or the NFC module 22e may be included in a single integrated chip (IC) or IC package. The RF module 22f may transmit and receive communication signals (for example, RF signals). The RF module 22f may include, for example, a transceiver, a power amplifier module (PAM), a frequency filter, a low noise amplifier (LNA), an antenna, or the like. According to another embodiment, at least one of the cellular module 22a, the WiFi module 22b, the BT module 22c, the GNSS module 22d, and the NFC module 22e may transmit and receive RF signals via a separate RF module. The SIM 22g may include, for example, a card including the SIM and/or an embedded SIM. The SIM 22g may include a unique identifier (for example, integrated circuit card identifier (ICCID)) or subscriber information (for example, international mobile subscriber identity (IMSI)).

The memory 23 may include, for example, an internal memory 23a or an external memory 23b. The internal memory 23a may be at least one of, for example, a volatile memory (for example, dynamic RAM (DRAM), static RAM (SRAM), or synchronous dynamic RAM (SDRAM)), and a non-volatile memory (for example, one time programmable ROM (OTPROM), programmable ROM (PROM), erasable and programmable ROM (EPROM), electrically erasable and programmable ROM (EEPROM), mask ROM, flash ROM, flash memory, a hard drive, and a solid state driver (SSD)). The external memory 23b may include a flash drive such as a compact flash (CF) drive, a secure digital (SD), a micro secure digital (micro-SD), a mini secure digital (mini-SD), an extreme digital (xD), a multi-media card (MMC), or a memory stick. The external memory 23b may be operatively or physically coupled to the electronic device 20 via various interfaces.

The sensor module 24 may, for example, measure physical quantities or detect operational states associated with the electronic device 20, and convert the measured or detected information into electric signals. The sensor module 24 may include at least one of, for example, a gesture sensor 24a, a gyro sensor 24b, an atmospheric pressure sensor 24c, a magnetic sensor 24d, an accelerometer 24e, a grip sensor 24f, a proximity sensor 24g, a color sensor (for example, a red, green, blue (RGB) sensor) 24h, a biometric sensor 24i, a temperature/humidity sensor 24j, an illumination sensor 24k, or an ultra violet (UV) sensor 24l. Additionally or alternatively, the sensor module 24 may include, for example, an electrical-nose (E-nose) sensor, an electromyography (EMG) sensor, an electroencephaloeram (EEG) sensor, an electrocardiogram (ECG) sensor, an infrared (IR) sensor, an iris sensor, and/or a finger print sensor. The sensor module 24 may further include a control circuit for controlling one or more sensors included therein. According to some embodiments, the electronic device 20 may further include a processor configured to control the sensor module 24, as a part of or separately from the processor 21. Thus, while the processor 21 is in a sleep state, the control circuit may control the sensor module 24.

The input device 25 may include, for example, a touch panel 25a, a (digital) pen sensor 25b, a key 25c, or an ultrasonic input device 25d. The touch panel 25a may operate in at least one of, for example, capacitive, resistive, infrared, and ultrasonic schemes. The touch panel 25a may further include a control circuit. The touch panel 25a may further include a tactile layer to thereby provide haptic feedback to the user. The (digital) pen sensor 25b may include, for example, a detection sheet which is a part of the touch panel or separately configured from the touch panel. The key 25c may include, for example, a physical button, an optical key, or a keypad. The ultrasonic input device 25d may be a device configured to identify data by detecting, using a microphone (for example, a microphone 28d), ultrasonic signals generated by an input tool capable of generating the ultrasonic signals.

The display 26 may include a panel 26a, a hologram device 26b, a projector 26c, and/or a control circuit for controlling these components. The panel 26a may be configured to be, for example, flexible, transparent, or wearable. The panel 26a and the touch panel 25a may be implemented as one or more modules. According to an embodiment, the panel 26a may include a pressure sensor (or a force sensor) for measuring the strength of the pressure of a user touch. The pressure sensor may be integrated with the touch panel 25a, or configured as one or more sensors separately from the touch panel 25a. The hologram device 26b may utilize the interference of light waves to provide a three-dimensional image in empty space. The projector 26c may provide an image by projecting light on a screen. The screen may be positioned, for example, inside or outside the electronic device 20. The interface 27 may include, for example, an HDMI 27a, a USB 27b, an optical interface 26c, or a D-subminiature (D-sub) 27d. The interface 27 may include, for example, a mobile high-definition link (MHL) interface, an SD/multimedia card (MMC) interface, or an infrared data association (IrDA) interface.

The audio module 28 may convert a sound to an electrical signal, and vice versa. The audio module 28 may process sound information input into, or output from, for example, a speaker 28a, a receiver 28b, an earphone 28c, or the microphone 28d. The camera module 29a is, for example, a device capable of capturing still images and a video. According to an embodiment, the camera module 29a may include one or more image sensors (for example, a front sensor or a rear sensor), a lens, an image signal processor (ISP), or a flash (for example, an LED or a xenon lamp). The power management module 29d may manage power of the electronic device 20. According to an embodiment, the power management module 29d may include a power management integrated circuit (PMIC), a charger IC, or a battery fuel gauge. The PMIC may adopt wired and/or wireless charging. The wireless charging may be performed, for example, in a magnetic resonance scheme, a magnetic induction scheme, or an electromagnetic wave scheme, and may use additional circuits for wireless charging, such as a coil loop, a resonance circuit, or a rectifier. The battery fuel gauge may measure, for example, a charge level, a voltage while charging, current, or temperature of the battery 29e. The battery 29e may include, for example, a rechargeable battery and/or a solar battery.

The indicator 29b may indicate specific states of the electronic device 20 or a part of the electronic device 20 (for example, the processor 21), for example, boot status, message status, or charge status. The motor 29c may convert an electrical signal into a mechanical vibration and generate vibrations or a haptic effect. The electronic device 20 may include a processing device for supporting mobile TV (for example, a GPU). The processing device for supporting mobile TV may process media data compliant with, for example, digital multimedia broadcasting (DMB), digital video broadcasting (DVB), or MediaFLO™. Each of the above-described components of the electronic device may include one or more parts and the name of the component may vary with the type of the electronic device. According to various embodiments, some component may be omitted from or added to the electronic device (for example, the electronic device 20). Or one entity may be configured by combining a part of the components of the electronic device, to thereby perform the same functions of the components prior to the combining.

Figure 3:
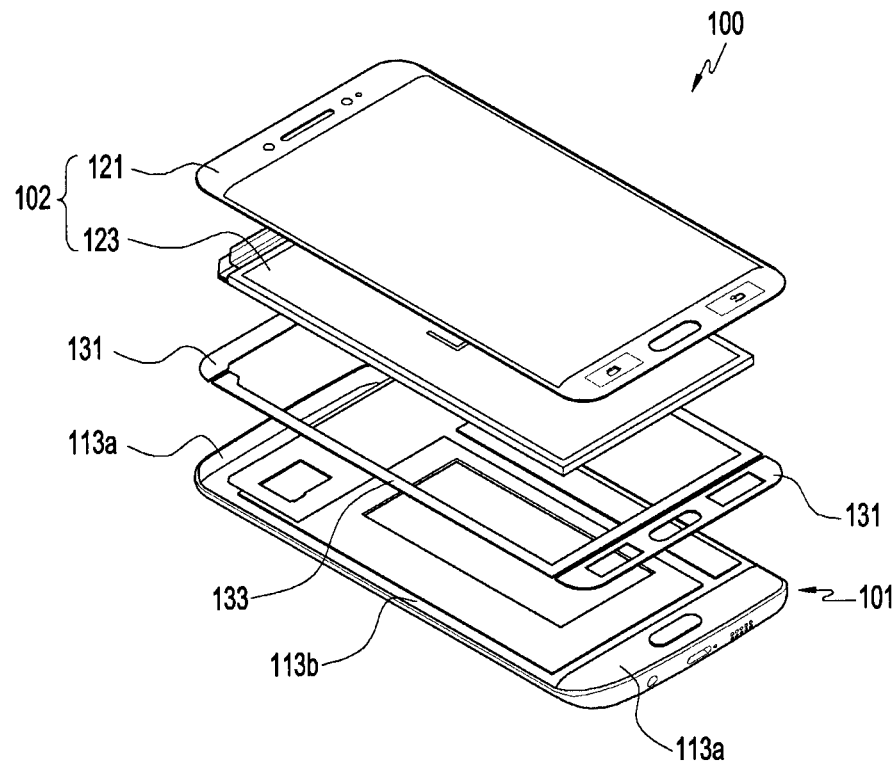
FIG. 3 is an exploded perspective view illustrating an electronic device according to various embodiments of the present disclosure.
Figure 4:
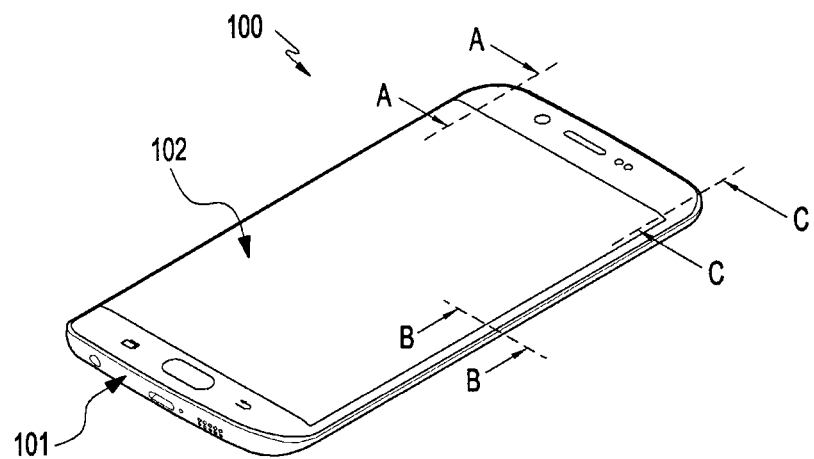
FIG. 4 is a perspective view illustrating an electronic device according to various embodiments of the present disclosure.

FIG. 3 is an exploded perspective view illustrating the electronic device 100 according to various embodiments of the present disclosure. FIG. 4 is a perspective view illustrating the electronic device 100 according to various embodiments of the present disclosure.

Referring to FIGS. 3 and 4, the electronic device 100 (for example, the electronic device 20 illustrated in FIG. 2) may include a housing 101, and a display device 102 mounted in the housing 101. While not shown, the housing 101 may accommodate a circuit board, a battery (for example, the battery 29e illustrated in FIG. 2), and others therein, and the display device 102 may be mounted on the front surface of the housing 101, thereby completing the exterior of the electronic device 100. According to an embodiment, the display device 102 may be bonded on the front surface of the housing 101 through one or more waterproof members 131, and one or more second waterproof members 133. For example, the first waterproof members 131 and the second waterproof members 133 may be bonding members (e.g., double-sided tapes) that bond the display device 102 to the housing 101, and also provide a waterproof function between the housing 101 and the display device 102.

According to various embodiments, the housing 101 may be provided, on the front surface thereof, with one or more first attaching surfaces 113a and one or more second attaching surfaces 113b. For example, the first attaching surfaces 113a may be formed, for example, at both end portions (e.g., a top end portion and a bottom end portion) in the length direction of the housing 101. According to an embodiment, the first attaching surfaces 113a may extend along the width direction of the housing 101. For example, the second attaching surfaces 113b may be formed at both end portions (e.g., both side ends) in the width direction of the housing 101. According to an embodiment, the second attaching surfaces 113b may extend along the length direction of the housing 101.

According to an embodiment, the first attaching surfaces 113a may be formed at the top and bottom end portions of the front surface of the housing 101, respectively, and the second attaching surfaces 113b may be formed at both side ends of the front surface of the housing 101, respectively. In some embodiments, the first attaching surfaces 113a and the second attaching surfaces 113b may be arranged alternately, for example, extending along the periphery of the housing 101 on the front surface of the housing 101, thereby substantially forming a closed loop (or polygon). In another embodiment, the first attaching surfaces 113a and the second attaching surfaces 113b may be formed to be stepped against each other, each forming a part of the front surface of the housing 101. For example, the second attaching surfaces 113b may be formed deeper than the first attaching surfaces 113a on the front surface of the housing 101. In another embodiment, an additional attaching surface may be formed on the housing 101 in addition to the first attaching surfaces 113a and the second attaching surfaces 113b. For example, a third attaching surface may be formed within an area surrounded by the first attaching surfaces 113a and the second attaching surfaces 113b. In some embodiments, the third attaching surface may be formed at an independent position with respect to the first attaching surfaces 113a and the second attaching surfaces 113b, and may be connected to one of the first attaching surfaces 113a and the second attaching surfaces 113b.

According to various embodiments, the display device 102 may include a window member 121 and a display panel 123 incorporated in the window member 121. The window member 121 may be disposed on the front surface of the housing 101, substantially forming the exterior of the electronic device 100 together with the housing 101. The window member 121 may be fabricated of a transparent material (for example, transparent synthetic resin or glass), and thus protect the display panel 123 against an ambient environment, while allowing transmission of a screen output from the display panel 123 therethrough. For example, with the display panel 123 engaged on the inner surface of the window member 121, the window member 121 may be mounted in the housing 101, and the display panel 123 may be accommodated in a space formed by the housing 101 and the window member 121.

In an embodiment, the first waterproof members 131 may extend along the width direction of the housing 101, and bond the window member 121 to parts of the housing 101. For example, with the display panel 123 engaged with the window member 121, the first waterproof members 131 may be attached onto the inner surfaces of the top and bottom end portions of the window member 121, respectively, and also onto the first attaching surfaces 113a, respectively. For example, the first waterproof members 131 may be provided on the top and bottom end portions of the housing 101, respectively, and bond parts of the window member 121 to parts (for example, the first attaching surfaces 113*a*) of the housing 101. A receiver for voice calling (for example, the receiver 28*b* illustrated in FIG. 2) may be disposed at the top end portion of the front surface of the housing 101, and a button (for example, the key 25*c* illustrated in FIG. 2) may be disposed at the bottom end portion of the front surface of the housing 101. The first waterproof member(s) 131 may be formed in a shape corresponding to the arrangement of the receiver or the button.

According to various embodiments, the second waterproof members 133 may bond parts of the display panel 123 inside the window member 121 to other parts (for example, the second attaching surfaces 113*b*) of the housing 101. For example, the second waterproof members 133 may be attached to both side ends of the display panel 123 inside the display panel 123, and onto the second attaching surfaces 113*b*, respectively. For example, the second waterproof members 133 may be provided at both side ends of the housing 101, and extend substantially along the length direction of the housing 101. According to an embodiment, one end of each of the second waterproof members 133 may be disposed in the vicinity of (substantially in contact with) one end of a first waterproof member 131. For example, the first waterproof members 131 and the second waterproof members 133 may be arranged alternately, forming a closed loop or a polygon.

According to various embodiments, in the display device 102, the first waterproof members 131 may be disposed on the inner surface of the window member 121, and the second waterproof members 133 may be disposed on the inner surface of the display panel 123. For example, in the display device 102, the first waterproof members 131 and the second waterproof members 133 may be disposed at different heights (e.g., heights corresponding to the thickness of the display panel 123). In an embodiment, as the first attaching surfaces 113*a* and the second attaching surfaces 113*b* are stepped against each other, the first waterproof members 131 and the second waterproof members 133 may stably bond the display device 102 to the housing 101.

According to various embodiments, as the first waterproof members 131 and the second waterproof members 133 are arranged to substantially form a closed loop along the periphery of the housing 101 on the front surface of the housing 101, the first waterproof members 131 and the second waterproof members 133 may provide a waterproof structure between the housing 101 and the display device 102. In some embodiments, since the first attaching surfaces 113*a* and the second attaching surfaces 113*b* are formed to be stepped against each other, a sealing member (for example, a later-described sealing member 435 illustrated in FIG. 12) may be provided in a part (e.g., a stepped part) in which each first attaching surface 113*a* is close to each second attaching surface 113*b* in order to provide a stable waterproof structure. For example, due to the steps between the first attaching surfaces 113*a* and the second attaching surfaces 113*b*, a discontinuous section may be formed between one end of each of the first waterproof members 131 and one end of each second waterproof member 133. The discontinuous section may be sealed by the sealing member, thus forming a stable waterproof structure. The waterproof structure using the sealing member in the discontinuous sections between the first waterproof members 131 and the second waterproof members 133 will be described below in greater detail.

Figure 5:
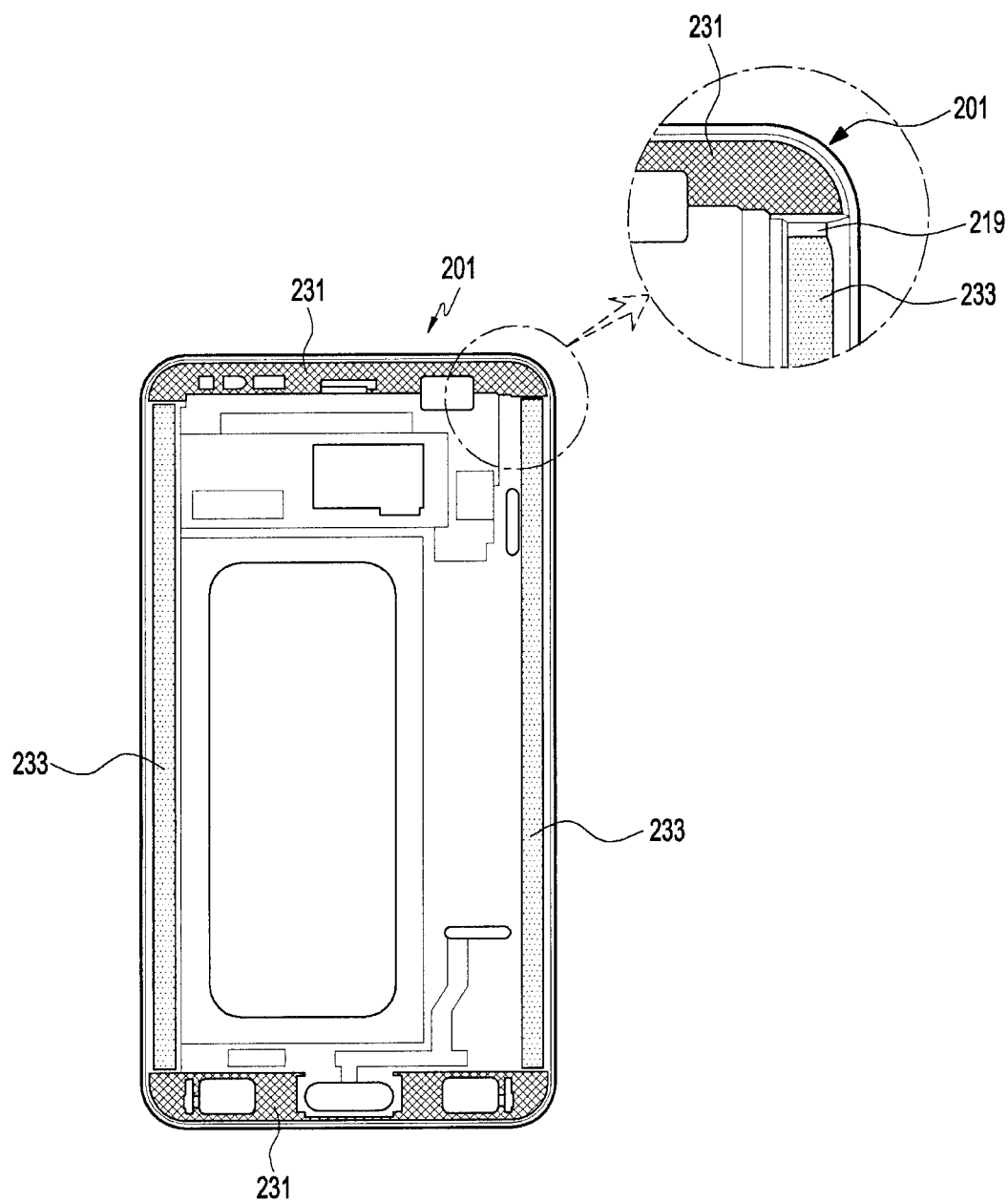
FIG. 5 is a plan view illustrating a housing of an electronic device according to another of various embodiments of the present disclosure.

FIG. 5 is a plan view illustrating a housing 201 in an electronic device according to another of the various embodiments of the present disclosure.

In the electronic device according to various embodiments of the present disclosure, a part of the front surface of the housing 201 may be formed to be curved, and the electronic device may include first waterproof members 231 attached on first attaching surfaces, and second waterproof members 232 attached on second attaching surfaces, on the front surface of the housing 201. The first attaching surfaces or the second attaching surfaces of the housing 201 may be curved, which will be described below with reference to FIG. 6 or FIG. 7. The first waterproof members 231 may be disposed respectively on the top and bottom end portions of the housing 201, and extend along the width direction of the housing 201 on the housing 201. The second waterproof members 233 may be disposed on both side ends of the housing 201, and extend along the length direction of the housing 201 on the housing 201.

According to an embodiment, as the first waterproof members 231 and the second waterproof members 233 are arranged alternately along the periphery of the housing 201, one end portion of each of the second waterproof members 233 may be disposed in the vicinity of one end portion of each of the first waterproof members 231. Stepped portions 219 corresponding to the thickness of a display device, for example, the thickness of a display panel mounted in the housing 201 may be formed between the first attaching surfaces and the second attaching surfaces of the housing 201. For example, the second waterproof members 233 that attach the display panel to the housing 201 may be disposed on the housing 201 deeper than the first waterproof members 231 that attach a window member of the display device to the housing 201. Therefore, a discontinuous section (e.g., a stepped portion 219) may be formed between one end portion of each of the first waterproof members 231 and one end portion of a second waterproof member 233 close to the end portion of the first waterproof members 231.

Figure 6:
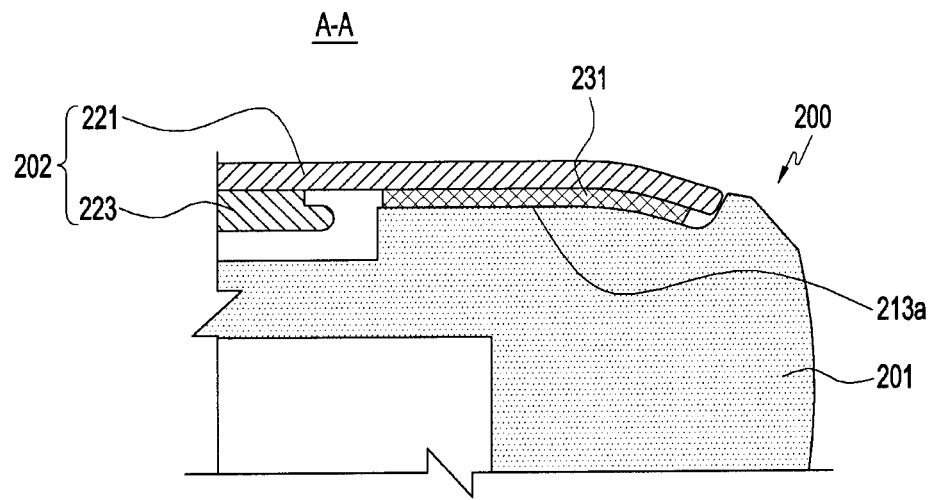
FIG. 6 is a sectional view illustrating a part of an electronic device according to another of various embodiments of the present disclosure.
Figure 7:
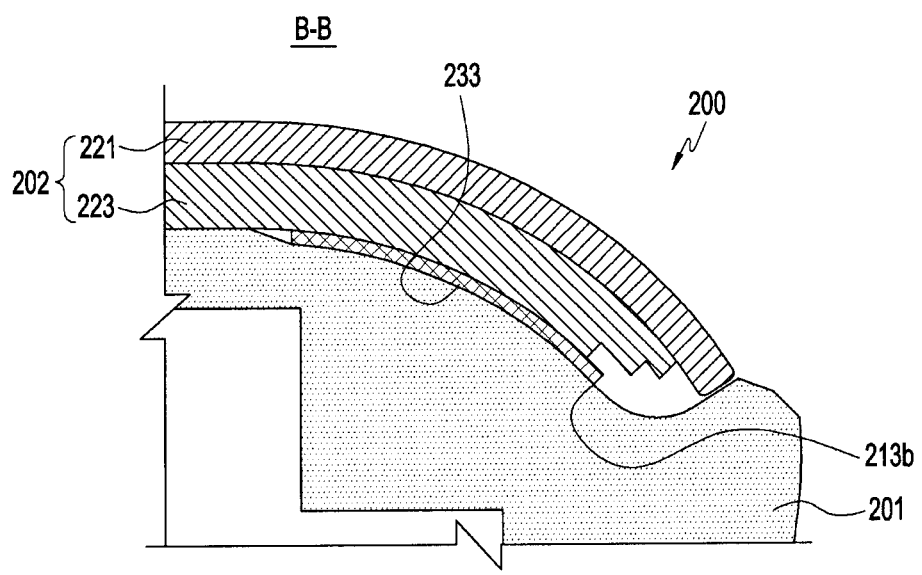
FIG. 7 is a sectional view illustrating another part of an electronic device according to another of various embodiments of the present disclosure.
Figure 8:
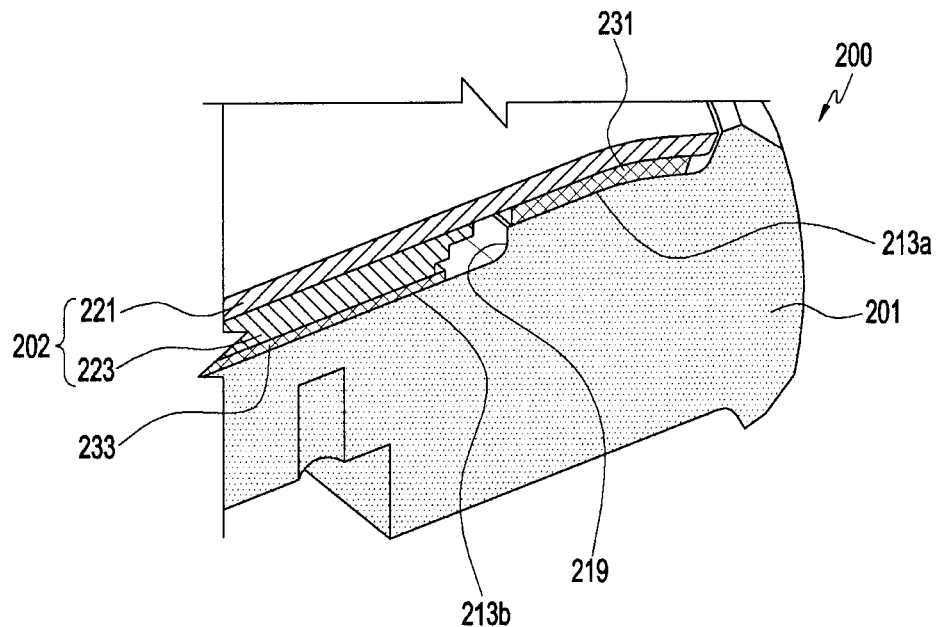
FIG. 8 is a sectional view illustrating another part of an electronic device according to another of various embodiments of the present disclosure.
Figure 9:
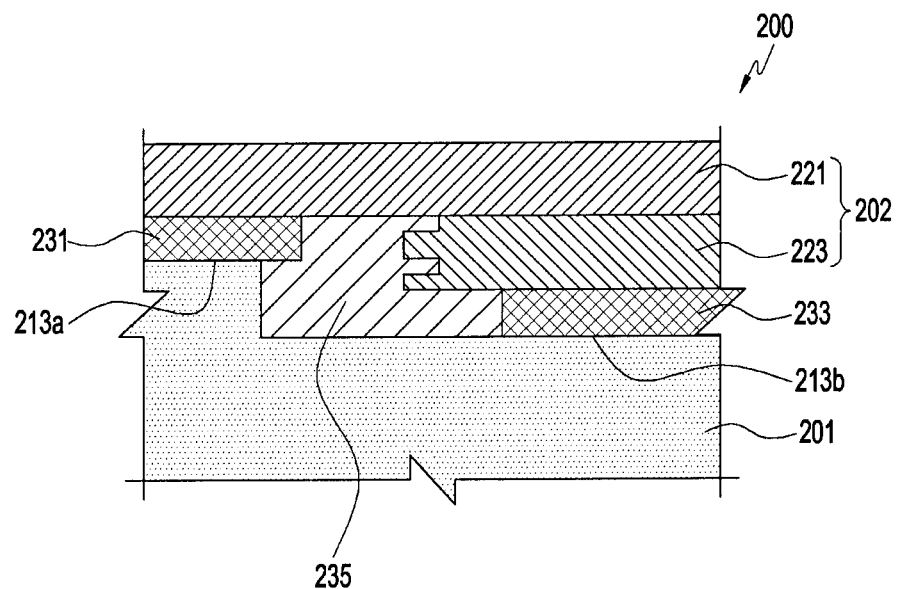
FIG. 9 is a sectional view illustrating arrangement of a sealing member in an electronic device according to another of various embodiments of the present disclosure.

FIG. 6 is a sectional view illustrating a part of an electronic device 200 according to another embodiment of the present disclosure, and FIG. 7 is a sectional view illustrating another part of the electronic device 200 according to another embodiment of the present disclosure. FIG. 8 is a sectional view illustrating another part of the electronic device 200 according to another embodiment of the present disclosure. FIG. 9 is a sectional view illustrating a sealing member 235 disposed in the electronic device 200 according to another embodiment of the present disclosure.

FIG. 6, FIG. 7, and FIGS. 8 and 9 illustrate sections of an electronic device, for example, the electronic device 200 (for example, the electronic device 100 illustrated in FIG. 3 or FIG. 4) including the housing 201, taken along line A-A, line B-B, and line C-C in FIG. 4, respectively.

Referring to FIG. 6, a window member 221 of a display device 202 may be bonded to the first attaching surface 213*a* of the housing 201 at the top end portion and/or bottom end portion of the housing 201 through a first waterproof member 231. The top end portion and/or the bottom end portion of a display panel 223 in the display device 202 may be parallel to the first waterproof member 231, apart from the first attaching surface 213*a*. Referring to FIG. 7, a second attaching surface 213*b* of the housing 201 may be curved, and a second waterproof member 233 may bond the display panel 223 to the second attaching surface 213*b*. For example, an edge of the inner surface of the display device 202 may be bonded to the housing 201 through the first waterproof member 231 and the second waterproof member 233. Herein, the first waterproof member 231 may attach the window member 221 to the housing 201, and the second waterproof member 233 may attach the display panel 223 to the housing 201.

Referring to FIGS. 8 and 9, when the display device 202 is engaged with the housing 201, the window member 221 is directly attached to the housing 201 at the top and bottom end portions thereof, thereby securing sufficient mechanical (physical) engagement force. When the display device 202 is engaged with the housing 201, the display panel 223 is attached to the housing 201 at both side ends thereof, thereby securing an extended screen output area in an area provided by the window member 221. In general, when the display device 202 is engaged with the housing 201 by directly bonding the window member 221 to the housing 201 at both side ends of the display device 202, the area of the display panel 223 may be reduced by as much as an area over which the window member 221 is bonded to the housing 201 at both side ends of the display device 202. In the electronic device (for example, the electronic device 200) according to various embodiments of the present disclosure, as parts of the display panel 223 are directly bonded to the housing 202 at at least side ends of the display device 202, the bezel area may be reduced in size, and the display panel 223 may be extended by as much as the size decrease of the bezel area.

According to various embodiments, in the display device 202, there may be a certain height difference between a part to which the first waterproof member 231 is bonded (for example, a part of the window member 221) and a part to which the second waterproof member 233 is bonded (for example, a part of the display panel 223). For example, there may be a height difference corresponding to the thickness of the display panel 223 between the first waterproof member 231 and the second waterproof member 233, and the height difference between the first waterproof member 231 and the second waterproof member 233 may correspond to a stepped portion 219 between the first attaching surface 213a and the second attaching surface 213b. The formation of the stepped portion 219 may result in the formation of a discontinuous section between one end portion of the first waterproof member 231 and one end portion of the second waterproof member 233 due to the height (or thickness) difference.

According to various embodiments, a space surrounded at least partially by an inner wall of the stepped portion 219 and/or the inner surface of the window member 221 may be formed in the discontinuous section between the one end portion of the first waterproof member 231 and the one end portion of the second waterproof member 233, and moisture or external foreign materials may be introduced into the housing 201 through the discontinuous section or space. The electronic device 200, according to various embodiments of the present disclosure, may fill the sealing member 235 in the discontinuous section or space, thereby ensuring stable dustproof and waterproof performance.

According to various embodiments, the sealing member 235 may seal the space or discontinuous section formed by the stepped portion 219 or the like, while connecting the first waterproof member 231 to the second waterproof member 233. For example, the sealing member 235 may provide the dustproof and waterproof functions by connecting at least one end portion of the first waterproof member 231 to one end portion of the second waterproof members 233 at both side ends of the housing 201 (or the window member 221). The sealing member 235 may be formed of a thermally curable resin, an adhesive resin, or a semi-solid or elastic resin like silicon.

Figure 10:
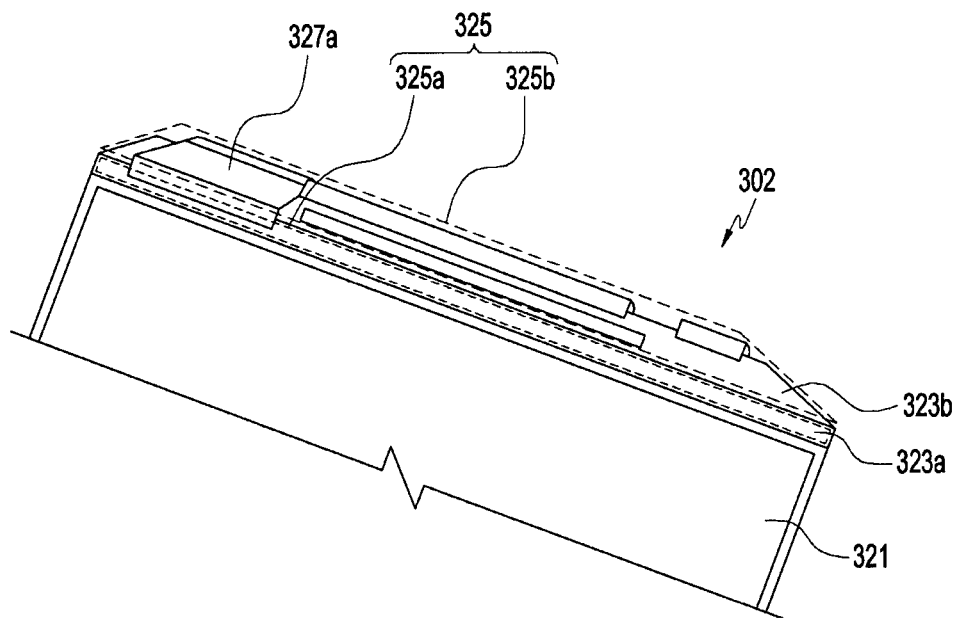
FIG. 10 is a perspective view illustrating a part of a display panel in an electronic device according to various embodiments of the present disclosure.
Figure 11:
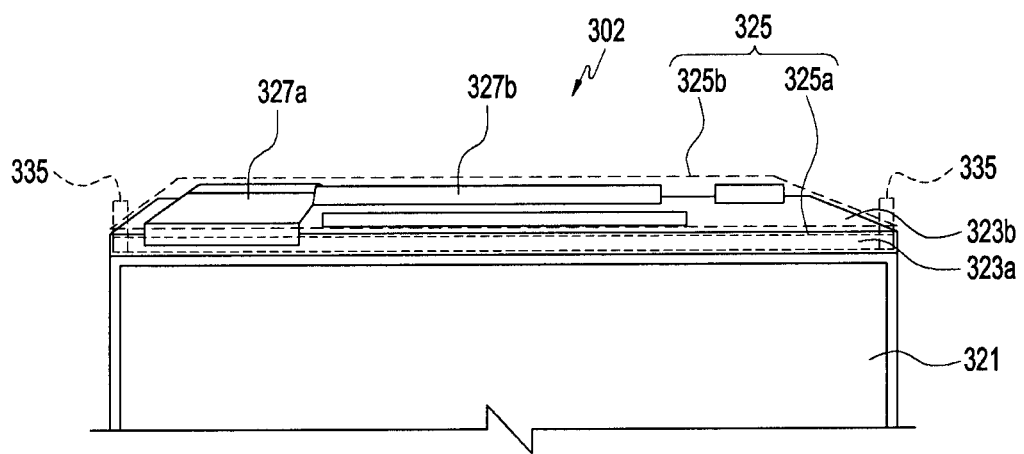
FIG. 11 is a plan view illustrating a part of a display panel in an electronic device according to various embodiments of the present disclosure.

FIG. 10 is a perspective view illustrating a part of a display panel 302 in an electronic device according to various embodiments of the present disclosure, and FIG. 11 is a plan view illustrating the part of the display panel 302 in the electronic device according to various embodiments of the present disclosure.

Referring to FIGS. 10 and 11, the display panel 302 may include a top glass 323a and a bottom glass 323b facing each other with a light emitting layer in between. According to various embodiments, a conductive layer that provides a touch screen function may be formed on the top glass 323a, and the top glass 323a may be connected to a circuit board of the electronic device (for example, the electronic device 100 illustrated in FIG. 1) through a first flexible printed circuit board (FPCB) 327a. The light emitting layer may be deposited on the bottom glass 323b, and include thin film transistors (TFTs) that apply an electrical signal to the light emitting layer. The top glass 323a may be bonded onto the bottom glass 323b, thereby sealing the light emitting layer. The bottom glass 323b may be connected to the circuit board of the electronic device through a second FPCB 327b. For example, the bottom glass 323b may substantially activate the light emitting layer by receiving an electrical signal, and thus display a realized screen.

In some embodiments, the display panel 302 may include an optical adhesive layer 321 and/or a polarization plate on the top surface of the top glass 323a, and the optical adhesive layer 321 and/or the polarization plate may be interposed between the top glass 323a and a window member (for example, the window member 221 illustrated in FIG. 8). For example, the top glass 323a may be bonded to the window member through the optical adhesive layer 321 and/the polarization plate. In some embodiments, the optical adhesive layer 321 and/the polarization plate may be included in the window member (for example, the window member 221 illustrated in FIG. 8) into which the display panel 302 is incorporated. Even though the optical adhesive layer and/or the polarization plate is interposed between the window member and the top glass 323a in the following embodiments, only the optical adhesive layer may be mentioned in the following description. However, this configuration does not limit the present disclosure, and it is to be understood that even though only the optical adhesive layer is mentioned in the following description, the polarization plate may also be included between the window member and the top glass.

The optical adhesive layer 321 may be formed of an adhesive resin having an optical transmittance close to 100% after being cured. In some embodiments, the optical adhesive layer 321 may have a certain viscosity even after being cured. For example, the optical adhesive layer 321 bonds the display panel 302 to the window member, and facilitates the removal of the display panel 302 from the window member without damaging the top glass 323a or the bottom glass 323b.

According to various embodiments, the display panel 302 may include a bonding area 325. The bonding area 325 may be substantially a part of the top glass 323a and/or the bottom glass 323b, including a part extending beyond the optical adhesive layer 321 from an edge of a side of the display panel 302. For example, the bonding area 325 may include a first bonding area 325a over which the top glass 323a extends beyond the optical adhesive layer 321, and a second bonding area 325b over which the bottom glass 323b extends beyond the optical adhesive layer 321. In some embodiments, the second bonding area 325b may extend farther than the first bonding area 325a.

According to various embodiments, the bonding area 325 may provide an area over which the first FPCB 327a and/or the second FPCB 327b is connected and bonded to the top glass 323a and/or the bottom glass 323b. For example, at least a part of the first bonding area 325a may be bonded to a part of the first FPCB 327a, and at least a part of the second bonding area 325b may be bonded to a part of the second FPCB 327b. In an embodiment, the area to which the first FPCB 327a is bonded may be apart from the area to which the second FPCB 327b is bonded on the display panel 302. In another embodiment, when the first and second FPCBs 327a and 327b are bonded to the top and bottom glasses 323a and 323b, respectively, an anisotropic conductive film (ACF) bonding scheme may be useful. The first and second FPCBs 327a and 327b may be connected to the conductive layer or TFTs that provide the touch screen function, and thus transfer a signal for a touch input or a screen output.

While not shown, a protective layer and/or a shielding layer (for example, a protective layer 329 illustrated in FIG. 12) may be provided on the bottom surface of the display panel 302, for example, the bottom surface of the bottom glass 323b. For example, the protective layer and/or the shielding layer may contain a sponge or the like to protect the bottom glass 323b or the like from mechanical interference or impact, or may include a copper thin film to provide an electromagnetic shielding function against other ambient electronic parts.

In the discontinuous section between the afore-described first and second waterproof members (for example, the waterproof members 231 and 233 illustrated in FIG. 9), the sealing member (for example, the sealing member 235 illustrated in FIG. 9) may overlap at least partially with the display panel 302. For example, a part of the sealing member 235 may be formed or disposed to overlap with a part (for example, the bonding area 325) of the top glass 323a and/or the bottom glass 323b, on the top surface of the display panel 302. According to various embodiments, the sealing member 235 may be disposed at both side ends of the display panel 302 in order to overlap with both end portions of the bonding area 325.

The arrangement structure of the sealing member will be described in greater detail with reference to FIG. 12.

Figure 12:
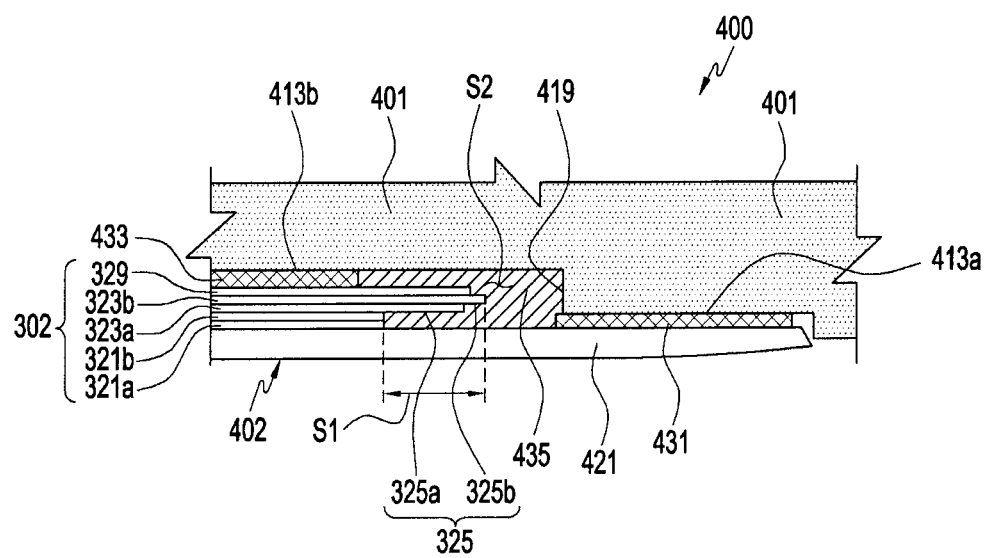
FIG. 12 is a sectional view illustrating a display device mounted in a housing in an electronic device according to various embodiments of the present disclosure.

FIG. 12 is a sectional view illustrating a display device 402 mounted in a housing in an electronic device according to various embodiments of the present disclosure.

Referring to FIG. 12, with the display panel 302 engaged with a window member 421 by means of the optical bonding layer 321, the display panel 302 may be disposed in a housing 401 of an electronic device 400. For example, a part of the window member 421 may be bonded to a first attaching surface 413a of the housing 401 by a first waterproof member 431, and a part of the display panel 302 may be bonded to a second attaching surface 413b of the housing 401 by a second waterproof member 433. As described before, the first waterproof member 431 and the second waterproof member 433 may be arranged alternately along the periphery of the front surface of the housing 401. In some embodiments, the first waterproof member 431 and the second waterproof member 433 may be arranged in a manner that forms a closed loop or a polygon on the front surface of the housing 401. According to an embodiment, as the display panel 302 includes the protective layer 329, the display panel 302 may protect the top and bottom glasses 323a and 323b from an ambient environment or an electromagnetic environment. For example, the protective layer 329 may contain a sponge or the like to protect the bottom glass 323b or the like from mechanical interference or impact, or may include a copper thin film to provide an electromagnetic shielding function against other adjacent electronic parts.

According to various embodiments, the display panel 302, for example, the bonding area 325 of the display panel 302 may be disposed to directly face the window member 421, apart from the window member 421 by a gap corresponding to the thickness of an optical adhesive layer 321a and/or the sum of the thickness of the optical adhesive layer 321a and the thickness of a polarization plate 321b. For example, another space (referred to as a "first space S1") corresponding to the thickness of the optical adhesive layer 321a (and/or the thicknesses of the optical adhesive layer 321a and the polarization plate 321b) may be formed between the display panel 302 (for example, the bonding area 325) and the window member 421. The first space S1 may be used for accommodating the afore-described first FPCB and/or second FPCB (for example, the first FPCB 327a and/or the second FPCB 327b illustrated in FIG. 10) therein. For example, the part of the afore-described first FPCB and/or second FPCB, which is actually bonded to a bonding area (for example, the first bonding area 325a and/or the second bonding area 325b), may be located within the first space S1.

According to various embodiments, when the display device 402 is mounted in the housing 401, a discontinuous section may be formed between the first attaching surface 413a and the second attaching surface 413b, for example, between the first waterproof member 431 and the second waterproof member 433 in a stepped portion 419. For example, a second space S2 may be formed in the discontinuous section, which is surrounded at least partially by the inner wall of the stepped portion 419 and the inner surface of the window member 421. A part of the display panel 302, for example, a part of the top glass 323a and/or a part of the bottom glass 323b, which forms the bonding area 325 may be disposed to protrude into the second space S2. According an embodiment, with the display device 402 mounted in the housing 401, the first space S1 may look like a part of the second space S2. For example, with the display device 402 mounted in the housing 401, the first space S1 may communicate with the second space S2.

In an embodiment, while the first waterproof member 431 and the second waterproof member 433 may be arranged in a closed loop or a polygon on the whole, thus forming a waterproof structure, the path of introducing moisture or foreign materials may be formed in a part in which the discontinuous section (for example, the stepped portion 419 and/or the second space S2) is formed. In another embodiment, while the display panel 302 and the window member 421, and also the display panel 302 and the second attaching surface 413b, may be brought into close contact in an area or section in which the optical adhesive layer 321a is disposed, the path of introducing moisture from both side ends of the window member 421 into an area or section (for example, the first space S1) corresponding to the bonding area 325 may be formed. According to various embodiments of the present disclosure, since the electronic device 400 includes the sealing member 435 filled in the first space S1 and/or the second space S2, the introduction of moisture into the discontinuous section between the first waterproof member 431 and the second waterproof member 432 may be blocked. For example, the sealing member 435 may seal the first space S1 and/or the second space S2 formed in the discontinuous section (for example, the section between the first waterproof member 431 and the second waterproof member 433, or the stepped portion 419) at at least both side ends of the window member 421 or both side ends of the housing 401.

According to an embodiment, with the display device 402 mounted in the housing 401, the sealing member 435 may be injected into the first space S1 and/or the second space S2. For example, the sealing member 435 may contain thermally curable resin, adhesive resin, semi-solid resin, elastic resin, or the like in a liquid state, semi-solid state, or viscous state. The sealing member 435 injected into the first space S1 and/or the second space S2 may be cured or maintained at least in a semi-solid or viscous state, thus sealing the first space S1 and/or the second space S2.

According to various embodiments, the first space S1 corresponds to the length of the bonding area 325 and/or the width of the display panel 302, and the sealing member 435 may be filled in the whole space S1. In an embodiment, since the sealing member 435 is intended to seal the discontinuous section between the first waterproof member 431 and the second waterproof member 433, the sealing member 435 may seal a part of the first space S1 at both ends of the display panel 302. In another embodiment, as the sealing member 435 connects the first waterproof member 431 to the second waterproof member 433, a closed-loop waterproof structure may be formed between the housing 401 and the display panel 302 along the periphery of the front surface of the housing 401. For example, as the sealing member 435 is formed and disposed at at least side ends of the bonding area 325, the sealing member 435 may form a waterproof structure in the discontinuous section between the first waterproof member 431 and the second waterproof member 433.

Figure 13:
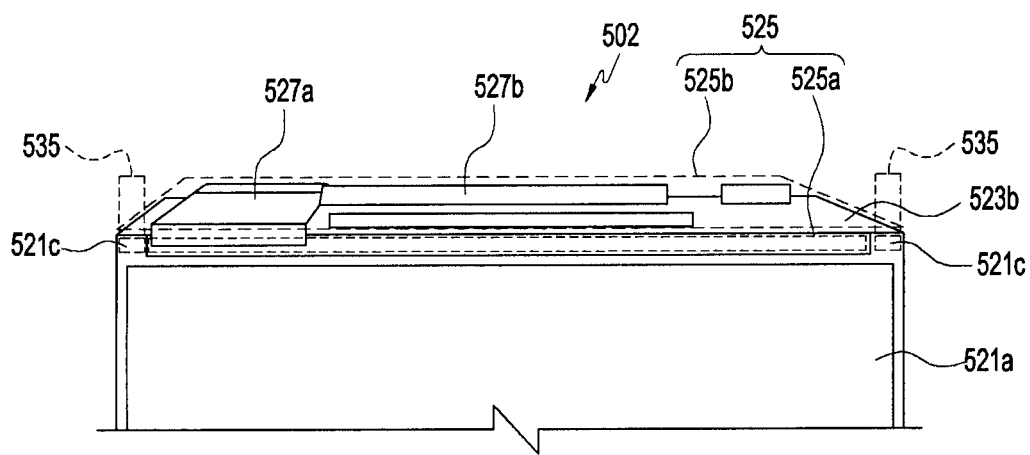
FIG. 13 is a plan view illustrating a modification example of a display panel in an electronic device according to various embodiments of the present disclosure.
Figure 14:
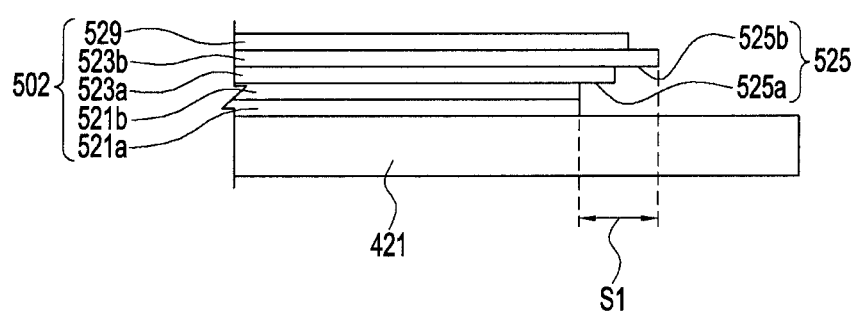
FIG. 14 is a sectional view illustrating a display panel bonded to a window member in an electronic device according to various embodiments of the present disclosure.

FIG. 13 is a plan view illustrating an exemplary modified display panel 502 in an electronic device according to various embodiments of the present disclosure. FIG. 14 is a sectional view illustrating the display panel 50e bonded to a window member in the electronic device according to various embodiments of the present disclosure.

Referring to FIGS. 13 and 14, the display panel 502 may include a top glass 523a and a bottom glass 523b engaged to face each other with a light emitting layer in between, a first FPCB 527a connected to the top glass 523a, a second FPCB 527b connected to the bottom glass 523b, and a bonding area 525 (for example, a first bonding area 525a and/or a second bonding area 525b) for bonding the first and second FPCBs 527a and 527b. In an embodiment, the display panel 502 may further include a protective layer (for example, the protective layer 329 illustrated in FIG. 12) on one surface of the bottom glass 523b. In another embodiment, the display panel 502 may be bonded to the inner surface of the window member 421, with an optical adhesive layer 521a and/or a polarization plate 521b in between. For example, the optical adhesive layer 521a may bond the display panel 502 to the window member 421.

According to various embodiments, the optical adhesive layer 521a and/or the polarization plate 521b may further include a protrusion area(s) 521c. Regarding the protrusion areas 521c, for example, parts of the optical adhesive layer 521a and/or the polarization plate 521b may protrude from both side ends of the window member 421 and/or the display panel 502 in an extended direction of the bonding area 525. For example, a part of the bonding area 525, for example, the first bonding area 525a may be interposed between the protrusion areas 521c. The protrusion area(s) 521c may decrease the size of a space filled with a sealing member (for example, the sealing member 435 illustrated in FIG. 12), for example, the first space S1 formed between the bonding area 525 and the window member 421. For example, a part of the optical adhesive layer 521a and/or the polarization plate 521b may be disposed in at least a part of an area in which the sealing member is to be formed and disposed to form a waterproof structure, thereby decreasing the size of the first space S1.

In an embodiment, a resin with a viscosity of 60,000 cps in a liquid (or viscous) state may be injected into the first space S1 (or the first space S1 and/or the second space S2 in FIG. 12), thus forming the sealing member (for example, the sealing member 435 illustrated in FIG. 12). If the height of the first space S1 (for example, the gap between the bonding area 525 and the inner surface of the window member 421) is 0.45 mm, and the length of the first space S1 (for example, the length of the first space S1 in a horizontal direction in FIG. 14) exceeds 1.2 mm, it may be difficult to completely seal the first space S1 with the injection of the resin having the viscosity of 60,000 cps. For example, when the resin having the viscosity of 60,000 cps is injected into a 0.45-mm high space, the resin is injected successfully for a distance of up to about 1.2 mm, but may be dispersed or injected in an unintended direction beyond the distance of 1.2 mm.

According to various embodiments, the protrusion areas 521c may decrease the length of the space (for example, the first space S1) in which the sealing member is to be formed and disposed to or below a distance for which the sealing resin may be stably injected. For example, the protrusion areas 521c may control the length of the first space S1 to a value that allows the stable injection of the sealing resin.

Figure 15:
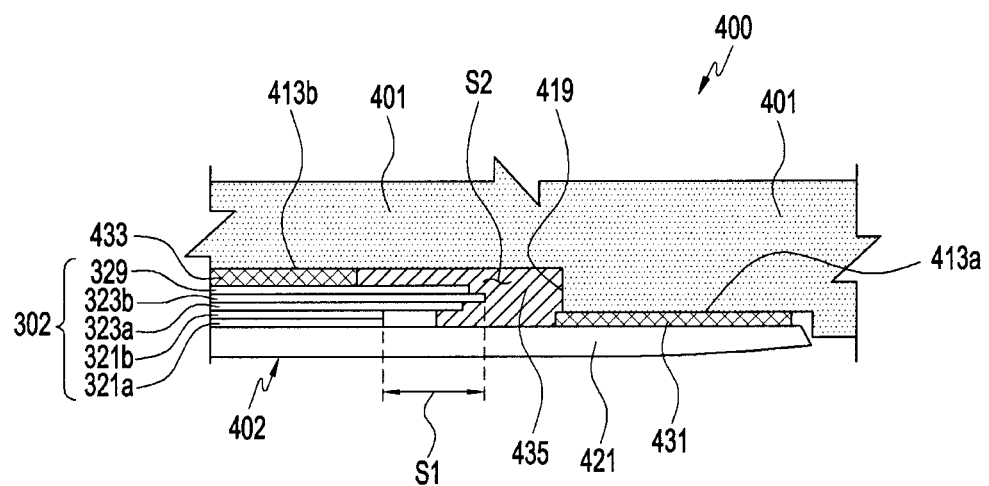
FIGS. 15 and 16 are sectional views illustrating a display device mounted in a housing of an electronic device according to various embodiments of the present disclosure.
Figure 16:
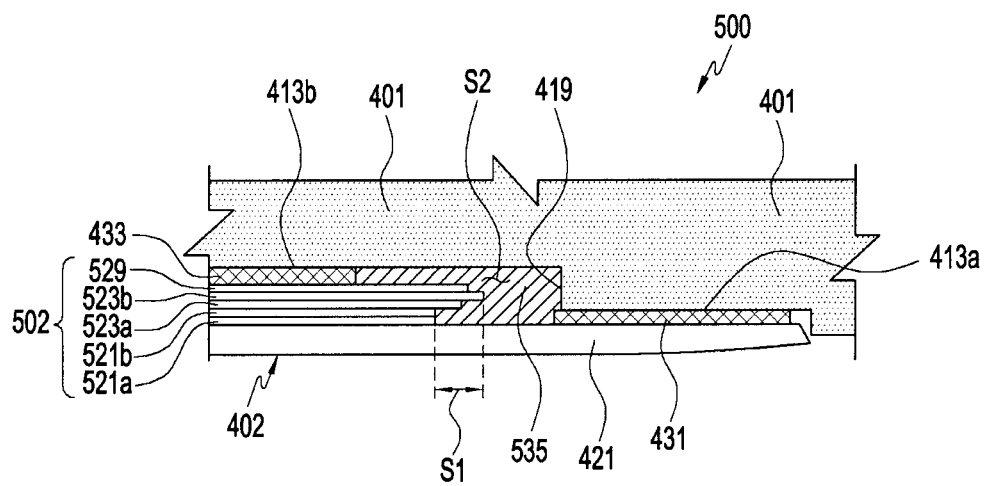

FIGS. 15 and 16 are sectional views illustrating the display devices 302 and 502 mounted in a housing of an electronic device according to various embodiments of the present disclosure.

Referring to FIG. 15, as described before, the sealing member 435 may not fully seal the first space S1 according to the length of the first space S1 (for example, the length of the bonding area 325 extending from the periphery of the optical adhesive layer 321a in a horizontal direction in FIG. 15). For example, if the space S1 has a height of 0.45 mm and a length of about 2.5 mm, the sealing member 435 may not be fully formed and disposed in a partial area of the first space S1 adjacent to the optical adhesive layer 321a.

Referring to FIG. 16, in an electronic device 500 according to various embodiments of the present disclosure, as protrusion areas (for example, the protrusion areas 521c illustrated in FIG. 13) are formed on the optical adhesive layer 521a and/or the polarization plate 521b, the length of the first space S1 may be decreased to or below 1.2 mm, and thus a sealing member 535 may be formed and disposed even at a position that comes in close contact with the optical adhesive layer 521a. For example, as the protrusion areas (for example, the protrusion areas 521c illustrated in FIG. 13) are formed, the sealing member 535 may form a more stable dustproof and waterproof structure.

Figure 17:
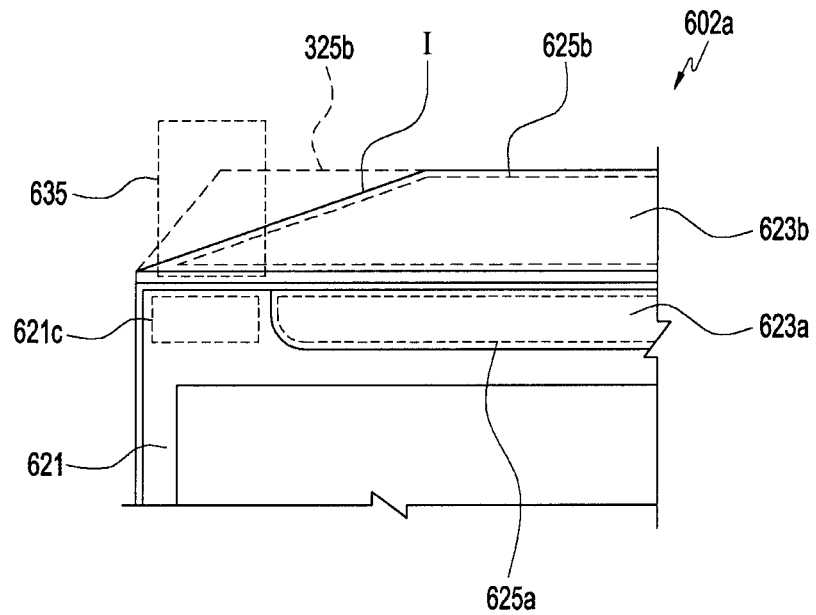
FIGS. 17 and 18 are enlarged plan views illustrating a part of another modification example of a display panel in an electronic device according to various embodiments of the present disclosure.
Figure 18:
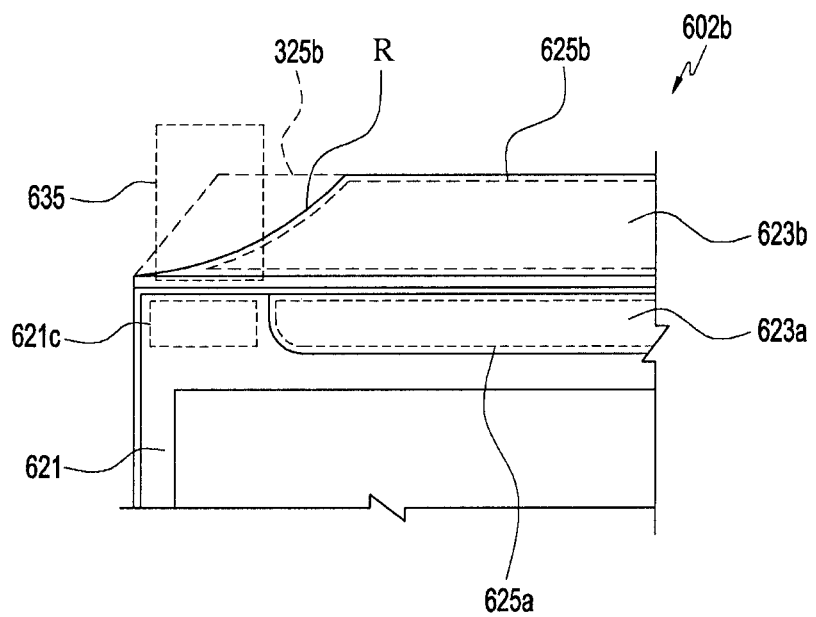

FIGS. 17 and 18 are enlarged plan views illustrating parts of other exemplary modified display panels 602a and 602b in an electronic device according to various embodiments of the present disclosure.

Referring to FIGS. 17 and 18, each of the display panels 602a and 602b may include a bonding area (for example, a first bonding area 625a of a top glass 623a and a second bonding area 625b of a bottom glass 623b) extended beyond an optical adhesive layer 621 from an edge of one side of the display panel. In an embodiment, one end portion and/or both end portions of the bonding area (for example, a part(s) in which a sealing member 635 is to be formed and disposed) may be inclined as indicated by reference symbol I or curved as indicated by reference symbol R.

As described before, a more stable dustproof and waterproof structure may be formed by reducing the horizontal length of a first space (for example, the first space S1 illustrated in FIG. 12). As at least one end portion of the bonding area is inclined as indicated by reference numeral I or curved as indicated by reference numeral R in the display panels 602a and 602b, the length of the first space may be decreased. For example, as one end portion of the bonding area is inclined as indicated by reference numeral I or curved as indicated by reference numeral R, it may be noted that the bonding area (for example, the second bonding area 625b) overlaps with the sealing member 635 over a smaller area, compared to the bonding area (for example, the second bonding area 325b in FIG. 11) in the structure illustrated in FIG. 11. According to various embodiments, if protrusion areas 621c (for example, the protrusion areas 521c illustrated in FIG. 13) are further formed on the optical adhesive layer 621 (and/or a polarization plate) disposed on each of the display panels 602a and 602b, a space for forming the sealing member 635 therein (for example, the first space S1 illustrated in FIG. 12) may become smaller, and thus the sealing member 635 may form a more stable dustproof and waterproof structure.

Figure 19:
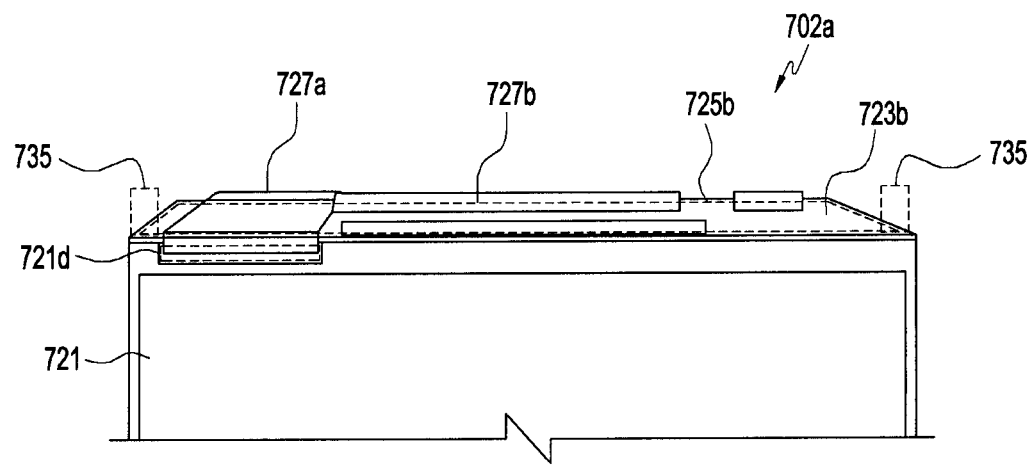
FIGS. 19 and 20 are plan views illustrating other modification examples of a display panel in an electronic device according to various embodiments of the present disclosure.
Figure 20:
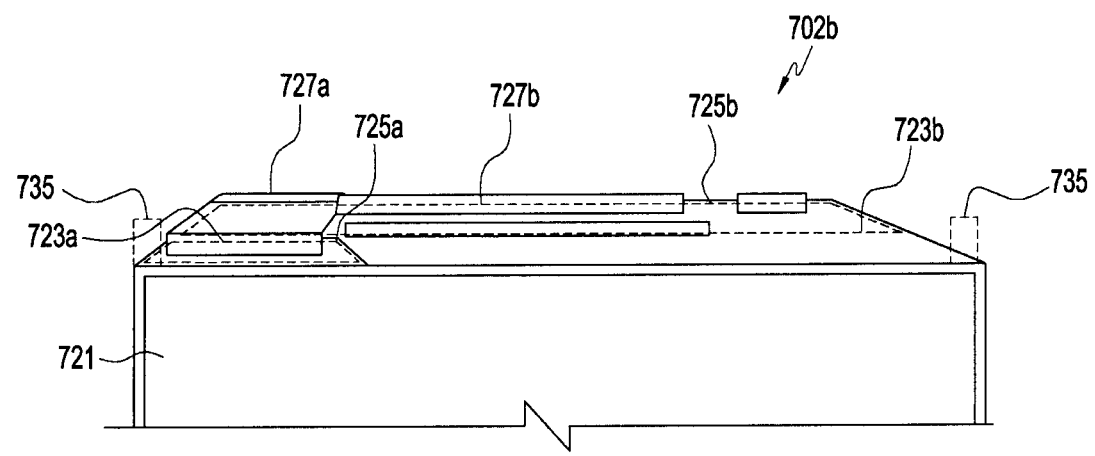

FIGS. 19 and 20 are enlarged plan views illustrating parts of other exemplary modified display panels 702a and 702b in an electronic device according to various embodiments of the present disclosure.

Referring to FIGS. 19 and 20, the display panel 702a may include a bonding area (for example, a second bonding area 725b of a bottom glass 723b) extending beyond an optical adhesive layer 721, at an edge of one side of the display panel 702a. A part of the bottom glass 723b may extend further from one side of the optical adhesive layer 721, thus being bonded to a second FPCB 727b. According to an embodiment, the optical adhesive layer 721 provided on the display panel 702a may be coated substantially on the whole top glass of the display panel 702a. In another embodiment, if a conductive layer is provided on the top glass of the display panel 702a in order to provide a touch screen function, an avoidance groove 721d may be formed by removing a part of the optical adhesive layer 721 (for example, a part of an edge adjacent to the second bonding area 725b). For example, the part of the top glass exposed through the avoidance groove 721d may be used as a first bonding area to bond the first FPCB 727a.

In the foregoing embodiment(s), the height of a space (for example, the first space S1 illustrated in FIG. 12) formed between the display panel (for example, the bonding area 325 illustrated in FIG. 12) and the window member (for example, the window member 521 illustrated in FIG. 12) may be determined to be substantially a gap between the first bonding area (for example, the first bonding area 325a illustrated in FIG. 12) of the top glass and the inner surface of the window member. On the other hand, when the display panel 702a, according to the embodiment illustrated in FIG. 19, is engaged with the window member, the height of a space (for example, the first space S1 in FIG. 12) in which a sealing member is to be formed may be determined by the gap between the bottom glass 723b (for example, the second bonding area 725b) and the window member. For example, in the embodiment of FIG. 19, the height of a space in which the sealing member 735 is to be formed may be determined by the sum of the thickness of the optical adhesive layer 721 (and/or the polarization plate) and the thickness of the top glass. Compared to the embodiment illustrated in FIG. 12, a sealing resin with which to form the sealing member 735 may be injected as easily as the increment of the height of the space in which the sealing member 735 is to be formed (for example, the first space S1 in FIG. 12).

According to various embodiments, the afore-described protrusion areas (for example, the protrusion areas 521c in FIG. 13) or the inclined or curved bonding area (for example, as indicated by I in FIG. 17 or as indicated by C in FIG. 18) may be combined with the embodiment of FIG. 19 or the like.

The above-described bonding area (for example, the above-described first bonding area and/or second bonding area) may extend from one side of the optical adhesive layer, substantially in correspondence with a width required for bonding to the first and/or second FPCB (for example, a length measured in the width direction of the foregoing display panel). Referring to FIG. 20, a first bonding area 725a of a top glass 723a may be formed substantially at one portion of the display panel 702b, and the height of a space in which a sealing member 735 is to be formed at least at the other end portion of the display panel 702b may be determined by the sum of the thicknesses of the optical adhesive layer 721 (and/or a polarization plate) and the thickness of the top glass 723a. For example, a more stable dustproof and waterproof structure may be formed in a discontinuous section between a first waterproof member (for example, the first waterproof member 413a in FIG. 12) and a second waterproof member (for example, the second waterproof member 413b in FIG. 12) by forming as much of the first bonding area 725a and/or the second bonding area 725b as needed for bonding using an ACF.

Figure 21:
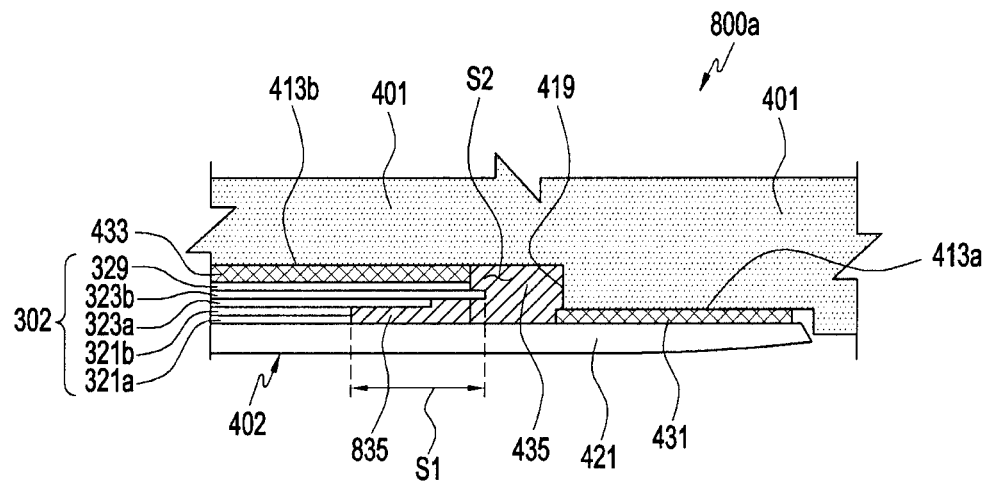
FIGS. 21 and 22 are sectional views illustrating an electronic device according to another of various embodiments of the present disclosure.
Figure 22:
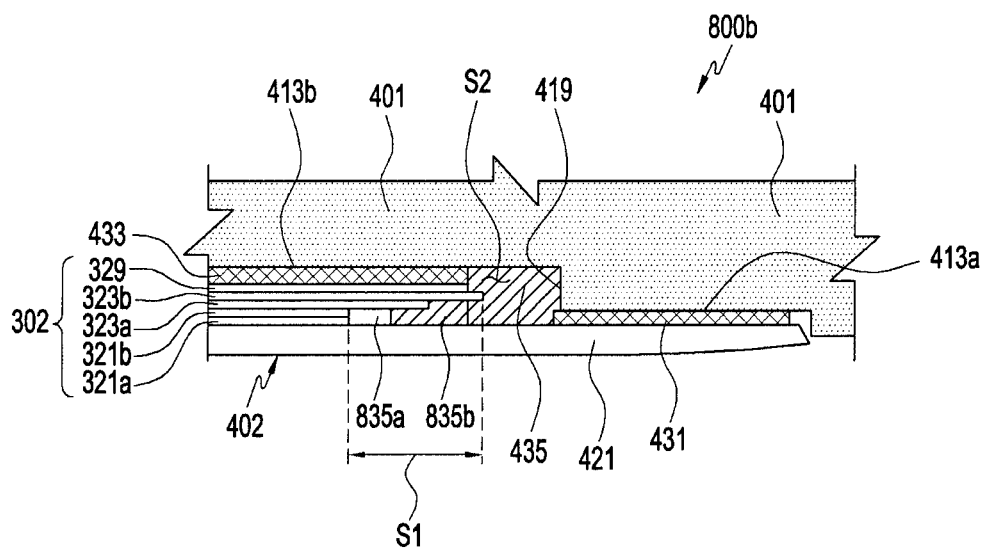

FIGS. 21 and 22 are sectional views illustrating electronic devices 800a and 800b according to another of the various embodiments of the present disclosure.

Referring to FIGS. 21 and 22, each of the electronic devices 800a and 800b (and/or a display device), according to various embodiments of the present disclosure, may include the sealing member 435 formed and disposed between the first waterproof member 431 and the second waterproof member 433. According to various embodiments, the sealing member 435 may include one or more third waterproof members 835, 835a, and 835b disposed in the first space S1 (for example, a space between the bonding area 325 of the display panel 302 and the inner surface of the window member 421). In an embodiment, the third waterproof members 835, 835a, and 835b may be formed by coating a thermally curable resin, an adhesive resin, or a semi-solid or elastic resin such as silicon on at least a part of an area in which the sealing member is to be formed and disposed before the display panel 302 is disposed on the window member 421. For example, an adhesive member 835a, such as double-sided tape, may be formed in an area corresponding to the first space S1 formed by engaging the display panel 302 with the window member 421, and a sealing resin 835b (for example, a thermally curable resin, an adhesive resin, or a semi-solid or elastic resin such as silicon) may be coated on another part. For example, the adhesive member 835a and the sealing resin 835b may be combined into the third waterproof member.

As described above, in a display device and/or an electronic device according to various embodiments of the present disclosure, when the display device is engaged with a housing, parts of a display panel are bonded to parts of the housing at least at both side ends, thereby reducing the bezel area. For example, an extended display panel may be mounted in a limited area of a window member, and thus a screen output area may be extended. In an embodiment, when the display device is bonded to the housing, a sealing member formed of an adhesive resin or the like is disposed in a discontinuous section between a first waterproof member and a second waterproof member, thereby forming a stable waterproof structure. In another embodiment, even when another discontinuous space (for example, the afore-described first space S1) is formed between the window member and the display panel, the sealing member may also seal this discontinuous section. In another embodiment, the sealing member may include a third waterproof member disposed in the first space, or seal the discontinuous section between the first waterproof member and the second waterproof member, together with the third waterproof member.

The sealing member may be formed by injecting a sealing resin in a state where the display device (for example, a module of the window member and the display panel in combination) is engaged with the housing of the electronic device. In another embodiment, if the sealing member includes the third waterproof member, at least the third waterproof member may be disposed or coated before the display panel is engaged with the window member.

While it is said in the above description that the sealing member may be partially "formed and disposed in the first space", the present disclosure is not limited thereto. For example, the "first space" mentioned in the above embodiments may refer to a space between the bonding area of the display panel and the inner surface of the window member, and the sealing member may be formed at both side ends of the first space (for example, at both side ends of the display device or the housing).

As described above, a display device and/or an electronic device including the same according to various embodiments of the present disclosure may include:

a window member;

an optical adhesive layer coated on an inner surface of the window member;

a display panel bonded on the inner surface of the window member, with the optical adhesive layer therebetween;

a bonding area in which a part of the display panel extends beyond the optical adhesive layer from an edge of at least one side of the display panel, and directly faces the window member;

a first space formed between the window member and the bonding area, in correspondence with the thickness of at least the optical adhesive layer; and a sealing member filled at least partially in the first space.

According to various embodiments, the display device and/or an electronic device including the same may further include a polarization plate between the optical adhesive layer and the display panel, and the first space may be formed in correspondence with the sum of the thickness of the optical adhesive layer and the thickness of the polarization plate.

According to various embodiments, the display device and/or an electronic device including the same may further include a flexible printed circuit board bonded to the bonding area and electrically connected to the display panel.

According to various embodiments, the optical adhesive layer may include protrusion areas protruding from both side ends of the window member, respectively, and at least a part of the bonding area may be interposed between the protrusion areas.

According to various embodiments, the sealing member may be disposed at each of both side ends of the window member, and that comes in close contact with at least parts of the protrusion areas.

According to various embodiments, both ends of the bonding area may be inclined or curved at both side ends of the window member, and at least a part of the sealing member may be disposed in correspondence with the inclined or curved parts of both ends of the bonding area.

According to various embodiments, the display panel may include:

a top glass; and a bottom glass bonded to the top glass, facing the top glass, for sealing a light emitting layer.

The bonding area may include a first bonding area formed on the top glass, and a second bonding area extending from the bottom glass.

According to various embodiments, the display panel may further include:

a first flexible printed circuit board bonded to the top glass in the first bonding area; and a second flexible printed circuit board bonded to the bottom glass in the second bonding area.

According to various embodiments, the first bonding area may include an area facing the window member through an avoidance groove formed by removing a part of the optical adhesive layer.

According to various embodiments, the first bonding area may be formed by extending a part of the top glass beyond the optical adhesive layer.

According to various embodiments, an electronic device may include:

a housing having a front surface to which the window member is attached;

at least one first waterproof member bonding the window member to a part of the housing; and at least one second waterproof member bonding the display panel to another part of the housing, and having one end disposed adjacent to one end of the first waterproof member.

The housing may include:

a first attaching surface to which the first waterproof member is attached;

a second attaching surface to which the second waterproof member is attached; and a stepped portion formed between the first attaching surface and the second attaching surface.

The sealing member may further seal a second space formed at least partially by the inner wall of the stepped portion and the window member, while connecting one end of the first waterproof member to one end of the second waterproof member.

According to various embodiments, the sealing member may include a thermally curable resin or an adhesive resin filled at least in the second space.

According to various embodiments, the sealing member may include:

at least one third waterproof member disposed in the first space; and a thermally curable resin or an adhesive resin filled in the second space.

According to various embodiments, the first attaching surface and the second attaching surface may extend along the periphery of the front surface of the housing.

According to various embodiments, an electronic device may include:

a housing;

a window member mounted on a front surface of the housing;

a display panel having one surface bonded to an inner surface of the window member by an optical adhesive layer coated on the inner surface of the window member;

at least one first waterproof member bonding a part of the window member to the housing;

at least one second waterproof member bonding a part of the other surface of the display panel to the housing, and having one end portion disposed adjacent to one end portion of the first waterproof member;

a bonding area being a part of the display panel, extending beyond the optical adhesive layer from an edge of a side of the display panel, and disposed to face the window member directly;

a first space formed between the window member and the bonding area in a section between the first waterproof member and the second waterproof member, in correspondence with the thickness of the optical adhesive layer; and a sealing member sealing at least a part of the first space in a section between one end portion of the first waterproof member and one end portion of the second waterproof member, while connecting the first waterproof member to the second waterproof member.

According to various embodiments, the housing includes:

first attaching surfaces each being formed at one of top and bottom end portions of a front surface of the housing, and extending along a width direction of the housing; and second attaching surfaces each being formed at one of both side end portions of the housing between the top and bottom end portions of the front surface of the housing, and extending along a length direction of the housing.

The at least one first waterproof member may be attached to the respective first attaching surfaces, and the at least one second waterproof member may be attached to the respective second attaching surfaces.

According to various embodiments, the housing may further include a stepped portion formed between a first attaching surface and a second attaching surface at the top end portion or the bottom end portion of the housing.

The electronic device may further include a second space at least partially formed by the window member and the stepped portion.

According to various embodiments, the first space may communicate with the second space at both side ends of the housing, and the sealing member may include a thermally curable resin or an adhesive resin filled at least in the second space.

According to various embodiments, the optical protrusion layer may include protrusion areas protruding respectively from both side ends of the window member, and at least a part of the bonding area may be interposed between the protrusion areas.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed is:

1. A display device comprising:
   a window member;
   an optical adhesive layer coated on an inner surface of the window member;
   a display panel bonded on the inner surface of the window member, with the optical adhesive layer therebetween;
   a bonding area in which a part of the display panel extends beyond the optical adhesive layer from an edge of at least one side of the display panel, and directly faces the window member;
   a first space formed between the window member and the bonding area, in correspondence with a thickness of at least the optical adhesive layer; and
   a sealing member filled at least partially in the first space,
   wherein the optical adhesive layer comprises protrusion areas protruding from both side ends of the window member, respectively, and wherein at least a part of the bonding area is interposed between the protrusion areas.

2. The display device of claim 1, further comprising a polarization plate between the optical adhesive layer and the display panel,
   wherein the first space is formed in correspondence with a sum of the thickness of the optical adhesive layer and the thickness of the polarization plate.

3. The display device of claim 1, further comprising a flexible printed circuit board bonded to the bonding area and electrically connected to the display panel.

4. The display device of claim 1, wherein the sealing member is disposed at each of both side ends of the window member, and closely contacts at least parts of the protrusion areas.

5. The display device of claim 1, wherein both ends of the bonding area are inclined or curved at both side ends of the window member, and at least a part of the sealing member is disposed in correspondence with inclined or curved parts of both ends of the bonding area.

6. The display device of claim 1, wherein the display panel comprises:
   a top glass; and
   a bottom glass bonded to the top glass, facing the top glass, for sealing a light emitting layer, and
   wherein the bonding area includes a first bonding area formed on the top glass, and a second bonding area extended from the bottom glass.

7. The display device of claim 6, wherein the display panel further comprises:
   a first flexible printed circuit board bonded to the top glass in the first bonding area; and
   a second flexible printed circuit board bonded to the bottom glass in the second bonding area.

8. The display device of claim 6, wherein the first bonding area comprises an area facing the window member through an avoidance groove formed by removing a part of the optical adhesive layer.

9. The display device of claim 6, wherein the first bonding area is formed by extending a part of the top glass beyond the optical adhesive layer.

10. An electronic device comprising:
    a housing;
    a window member mounted on a front surface of the housing;
    a display panel having one surface bonded to an inner surface of the window member by an optical adhesive layer coated on the inner surface of the window member;
    at least one first waterproof member bonding a part of the window member to the housing;
    at least one second waterproof member bonding a part of the other surface of the display panel to the housing, and having one end portion disposed adjacent to one end portion of the first waterproof member;

a bonding area being a part of the display panel, extending beyond the optical adhesive layer from an edge of a side of the display panel, and disposed to face the window member directly;

a first space formed between the window member and the bonding area in a section between the first waterproof member and the second waterproof member, in correspondence with a thickness of the optical adhesive layer; and a sealing member sealing at least a part of the first space in a section between one end portion of the first waterproof member and one end portion of the second waterproof member, while connecting the first waterproof member to the second waterproof member, wherein the optical adhesion layer comprises protrusion areas protruding respectively from both side ends of the window member, and at least a part of the bonding area is interposed between the protrusion areas.

11. The electronic device of claim 10, wherein the housing comprises:

first attaching surfaces each being formed at one of top and bottom end portions of a front surface of the housing, and extending along a width direction of the housing; and second attaching surfaces each being formed at one of both side end portions of the housing between the top and bottom end portions of the front surface of the housing, and extending along a length direction of the housing, and wherein the at least one first waterproof member is attached to the respective first attaching surfaces, and the at least one second waterproof member is attached to the respective second attaching surfaces.

12. The electronic device of claim 11, wherein the housing further comprises a stepped portion formed between the first attaching surface and the second attaching surface at the top end portion or the bottom end portion of the housing, and wherein the electronic device further comprises a second space at least partially formed by the window member and the stepped portion.

13. The electronic device of claim 12, wherein the first space communicates with the second space at both side ends of the housing, and the sealing member includes a thermally curable resin or an adhesive resin filled at least in the second space.

* * * * *